(12) United States Patent
Yamamoto et al.

(10) Patent No.: US 11,336,254 B2
(45) Date of Patent: May 17, 2022

(54) COMPOSITE SUBSTRATE AND ACOUSTIC WAVE ELEMENT USING SAME

(71) Applicant: KYOCERA Corporation, Kyoto (JP)

(72) Inventors: Daisuke Yamamoto, Kizugawa (JP); Tetsuya Kishino, Nara (JP)

(73) Assignee: KYOCERA Corporation, Kyoto (JP)

( * ) Notice: Subject to any disclaimer, the term of this patent is extended or adjusted under 35 U.S.C. 154(b) by 736 days.

(21) Appl. No.: 16/305,646

(22) PCT Filed: May 30, 2017

(86) PCT No.: PCT/JP2017/020116
§ 371 (c)(1),
(2) Date: Nov. 29, 2018

(87) PCT Pub. No.: WO2017/209131
PCT Pub. Date: Dec. 7, 2017

(65) Prior Publication Data
US 2020/0287513 A1    Sep. 10, 2020

(30) Foreign Application Priority Data

May 30, 2016    (JP) ............................ JP2016-107805

(51) Int. Cl.
*H03H 9/02*    (2006.01)
*H03H 9/17*    (2006.01)
*H03H 9/25*    (2006.01)

(52) U.S. Cl.
CPC ........ *H03H 9/02039* (2013.01); *H03H 9/178* (2013.01); *H03H 9/25* (2013.01)

(58) Field of Classification Search
CPC ........ H03H 9/02; H03H 9/02023; H03H 9/25; H03H 9/17; H03H 9/19
See application file for complete search history.

(56) References Cited

U.S. PATENT DOCUMENTS

| | | | |
|---|---|---|---|
| 4,567,393 A * | 1/1986 | Asai | H03H 9/25 310/313 A |
| 8,115,365 B2 * | 2/2012 | Suzuki | H03H 3/10 310/313 R |
| 2004/0226162 A1 | 11/2004 | Miura et al. | |
| 2010/0182101 A1 | 7/2010 | Suzuki | |
| 2010/0244631 A1 | 9/2010 | Kobayashi et al. | |

FOREIGN PATENT DOCUMENTS

| | | |
|---|---|---|
| JP | 2004-343359 A | 12/2004 |
| JP | 2006-319679 A | 11/2006 |
| JP | 2010-187373 A | 8/2010 |
| JP | 2010-232725 A | 10/2010 |
| JP | 3187231 U | 11/2013 |
| JP | 2015-145054 A | 8/2015 |

* cited by examiner

*Primary Examiner* — Dean O Takaoka
(74) *Attorney, Agent, or Firm* — Procopio Cory Hargreaves and Savitch LLP

(57) ABSTRACT

A composite substrate 10 includes a first substrate 10 comprised of a piezoelectric single crystal and a second substrate 20 comprised of a silicon single crystal bonded to the first substrate 10. In the second substrate, a planar orientation is (111), and ψ of Euler angles (φ, θ, ψ) is offset from 0°. Due to this, a bulk wave spurious is reduced in a specific frequency band.

20 Claims, 19 Drawing Sheets

COMPOSITE SUBSTRATE AND ACOUSTIC WAVE ELEMENT USING SAME

TECHNICAL FIELD

The present invention relates to a composite substrate and an acoustic wave element using the same.

BACKGROUND ART

It was known in the past to bond a support substrate and a piezoelectric substrate to each other for the purpose of improving the electrical characteristics and provide electrodes on the composite substrate to prepare an acoustic wave element. Here, acoustic wave elements are for example used as bandpass filters in mobile phones and other communication devices. Further, composite substrates using lithium niobate or lithium tantalate as the piezoelectric substrates and using silicon, quartz, ceramic, or the like as the support substrates are known (for example, see Japanese Patent Publication No. 2006-319679A).

SUMMARY OF INVENTION

Technical Problem

However, in recent years, portable terminal devices used for mobile communications have been made increasing smaller in size and lighter in weight. Also, to realize a higher speech quality, an acoustic wave element provided with further higher electrical characteristics has been demanded. For example, in order to reduce leakage of input/output signals to an adjacent channel, an acoustic wave element excellent in attenuation characteristic in a specific frequency band out of the passband has been demanded.

The present disclosure is made in consideration of such technical problems and has as an object thereof to provide a composite substrate for providing an acoustic wave element excellent in electrical characteristics and an acoustic wave element using the same.

Solution to Problem

A composite substrate of the present disclosure is provided with a first substrate comprised of a piezoelectric single crystal and with a second substrate comprised of a silicon single crystal bonded to the first substrate. In the second substrate, a planar orientation is (111), and $\psi$ of Euler angles ($\varphi$, $\theta$, $\psi$) is offset from 0°.

A composite substrate of the present disclosure is provided with a first substrate comprised of a piezoelectric single crystal and with a second substrate comprised of a silicon single crystal bonded to the first substrate. In the second substrate, a planar orientation is any of (110), (100), and (211).

An acoustic wave element of the present disclosure is provided with either of the composite substrates explained above and an IDT electrode formed on an upper surface of the first substrate of the composite substrate.

Advantageous Effects of Invention

According to the composite substrate described above, an acoustic wave element excellent in electrical characteristics can be provided.

DESCRIPTION OF EMBODIMENTS

Below, one example of a composite substrate and an acoustic wave element of the present disclosure will be explained in detail by using the drawings.

(Composite Substrate)

Figure 1A:
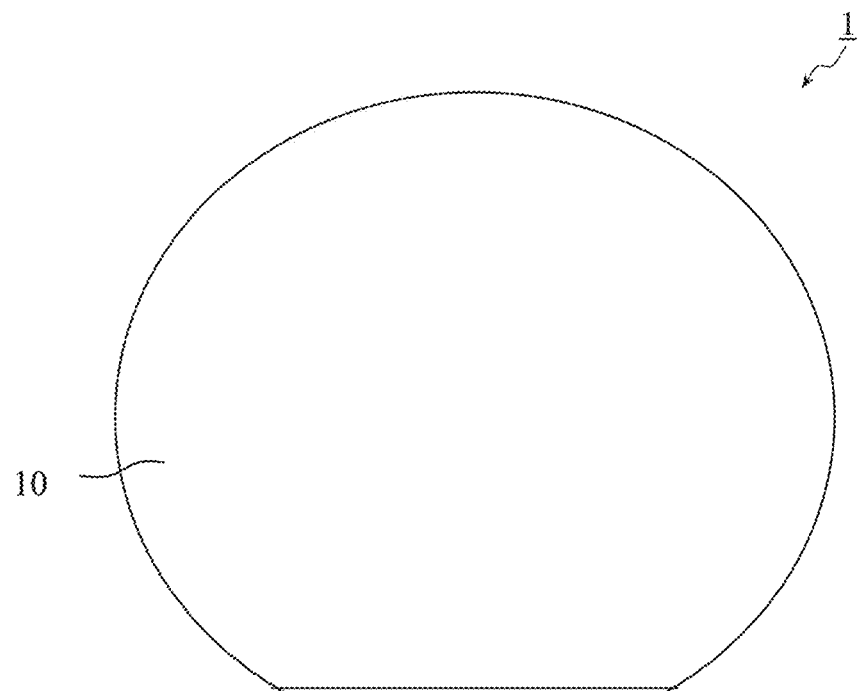
FIG. 1A is a top view of a composite substrate according to the present disclosure.
Figure 1B:
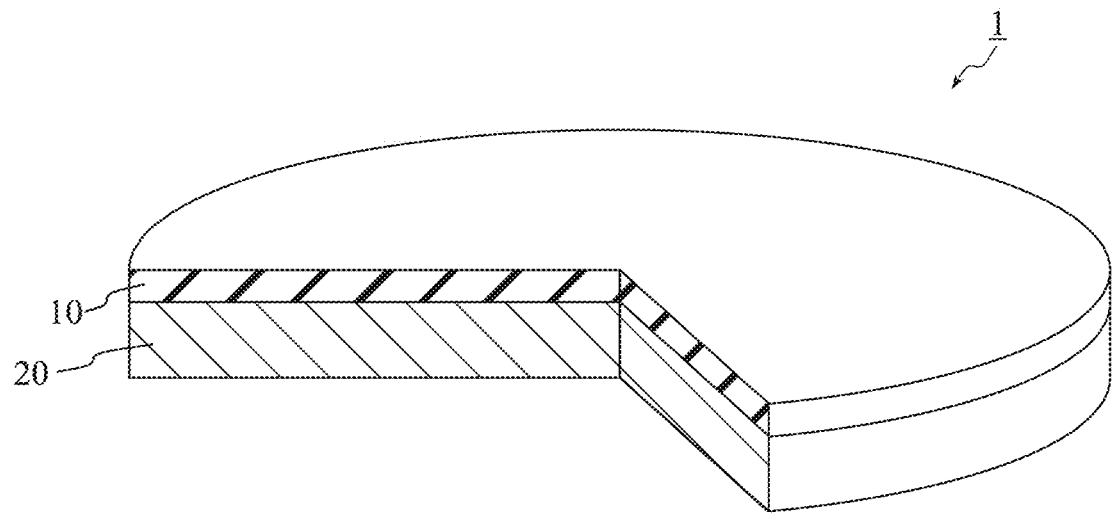
FIG. 1B is a partially cutaway perspective view of FIG. 1A.

A composite substrate 1 in the present embodiment is a so-called bonded substrate as shown in FIGS. 1A and 1B and is configured by a first substrate 10 and a second substrate 20 bonded to the first substrate 10. Here, FIG. 1A is a top view of the composite substrate 1, and FIG. 1B is a perspective view cutting away a portion of the composite substrate 1.

The first substrate is configured by a substrate of a single crystal having a piezoelectric characteristic made of a piezoelectric material comprised of a lithium niobate ($LiNbO_3$) crystal or lithium tantalate ($LiTaO_3$) crystal. Specifically, for example, the first substrate 10 is comprised of a 36° to 48° Y-X cut $LiTaO_3$ substrate (below, referred to as an "LT substrate").

The thickness of the first substrate 10 is constant and may be suitably set in accordance with the technical field to which the acoustic wave element is applied, the specifications demanded from the acoustic wave element, and so on. As an example, the thickness of the first substrate 10 is 0.3 μm to 30 μm. The planar shape and various dimensions of the first substrate 10 may be suitably set as well.

The second substrate 20 is for example formed by a material having a smaller thermal expansion coefficient than the material for the first substrate 10. Accordingly, when the temperature changes, thermal stress is generated in the first substrate 10. At this time, the temperature dependency and the stress dependency of the elastic constant are cancelled out by each other, consequently the change depending on temperature of the electrical characteristics of the acoustic wave element is compensated for. As such a material, for example there can be mentioned a single crystal of sapphire etc., silicon or another semiconductor, and a ceramic such as an aluminum oxide sintered body. In the present disclosure, as the second substrate 20, use is made of single crystal silicon. The crystal orientation and orientation flat angle of silicon will be explained later.

The thickness of the second substrate 20 is for example constant and may be suitably set in the same way as the thickness of the first substrate 10. However, the thickness of the second substrate 20 is set by considering the thickness of the first substrate 10 so that temperature compensation is suitably carried out. As an example, the thickness of the second substrate 20 is 50 to 300 μm relative to the thickness of the first substrate 10 of 1 to 30 μm. The planar shape and various dimensions of the second substrate 20 may be made equal to those of the first substrate 10 as well.

The first substrate 10 and the second substrate 20 may be bonded to each other by so-called direct bonding of bonding their bonding surfaces to each other without interposing any adhesive layer after activation treatment by plasma, an ion gun, neutron gun, or the like. In other words, the bonding surfaces of the first substrate 10 and second substrate 20 are provided with flatness enabling direct bonding. In general, the arithmetic average roughness of the bonding surfaces capable of direct bonding is less than 5 nm. By bonding substrates having such bonding surfaces to each other, unlike ones bonded through a so-called resin, metal, or other bonding layer, the crystal surfaces of the two substrates contact each other, therefore the acoustic boundary becomes clear.

When bonding the two substrates to each other, they are bonded by making their orientation flats flush with each other.

(Acoustic Wave Element)

Figure 2:
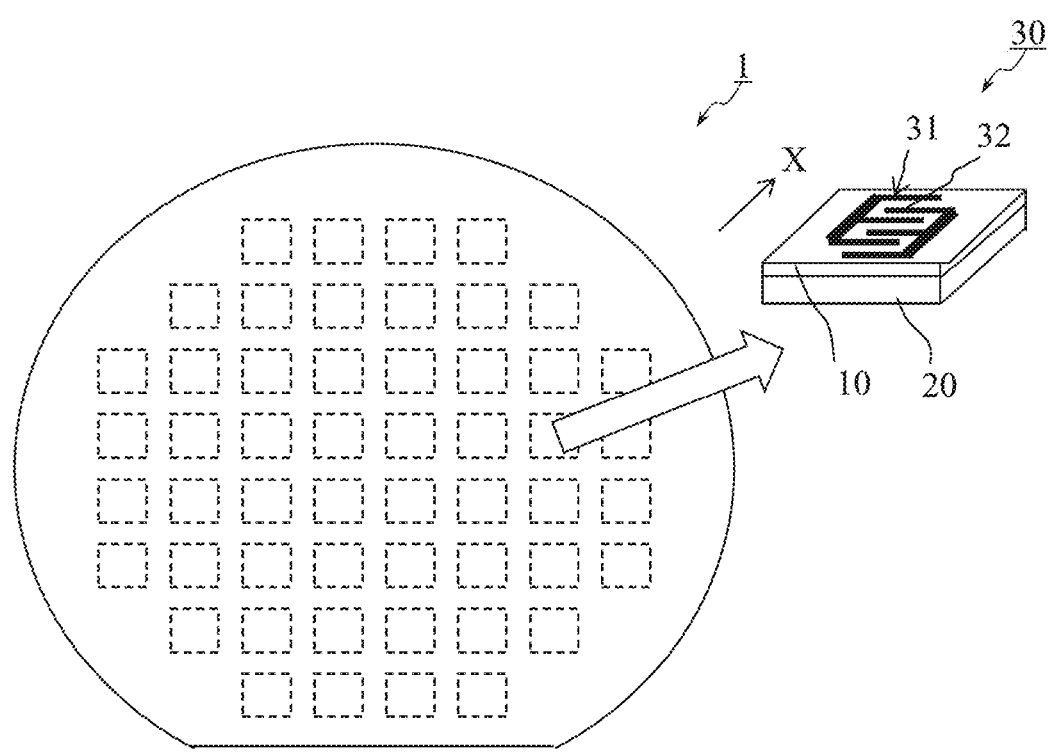
FIG. 2 An explanatory view of a surface acoustic wave element according to the present disclosure.

Further, the composite substrate 1 is divided into a plurality of sections as shown in FIG. 2. Each section becomes an acoustic wave element 30. Specifically, the composite substrate 1 is cut into pieces at each section to form acoustic wave elements 30. In each acoustic wave element 30, an IDT electrode 31 exciting the surface acoustic wave is formed on the upper surface of the first substrate 10. The IDT electrode 31 has a plurality of electrode fingers 32, and the acoustic wave propagates along the direction of arrangement of the same. Here, this direction of arrangement is substantially parallel to the X-axis of the piezoelectric crystal of the first substrate 10.

The acoustic wave element 30, by using the composite substrate 1, can suppress change of the frequency characteristic (electrical characteristics) due to a temperature change. On the other hand, since the first substrate 10 is thin and the second substrate 20 is bonded to the former, in the acoustic wave element 30, the bulk wave is reflected at the lower surface of the first substrate 10 and bulk wave spurious signals are generated. If such bulk wave spurious signals are generated in a frequency band (below, sometimes referred to as the "2f-band") which is two times the passband at the time of configuration of a filter by combining a plurality of IDT electrodes 31, distortion occurs in the high frequency signals. For this reason, desirably the bulk wave spurious signals in the 2f-band are reduced or eliminated.

As a result of intensive studies on such bulk wave spurious signals in the 2f-band, the inventors found out that the bulk wave spurious signals in the 2f-band could be reduced by bonding the second substrate 20 to the first substrate 10 in a state where the crystal surface of the second substrate 20 and the orientation flat direction are set in specific relationships. Note that, "adjustment of the orientation flat direction" of the second substrate 20 means rotation while changing $\psi$ of the Euler angles ($\varphi$, $\theta$, $\psi$). Further, this also means rotation of the second substrate 20 relative to the orientation flat angle of the first substrate 10 and also means change of the direction of the silicon crystal relative to the X-axis of the piezoelectric crystal of the first substrate 10. For this reason, "adjustment of the orientation flat direction" will be sometimes marked by $\psi$ of the Euler angles or shown by the angle formed by the silicon crystal with respect to the X-axis of the first substrate 10.

Embodiment of Composite Substrate 1

Below, an example of the configuration of a composite substrate 1 capable of reducing the bulk wave spurious signals in the 2f-band will be explained. First, as the second substrate 20, use is made of a substrate in which the planar orientation of silicon is made (111) and the direction of the orientation flat is rotated from the usual {110} by an angle of 60°±15°. Note that, {110} indicates the orientation and does not indicate planes equivalent to the (110) plane all together.

Here, for example, when the orientation is rotated by 60°, the crystal orientation expressed by the Euler angles of the second substrate 20 becomes (−45°, −54.7°, 60°). Further, the first substrate 10 is provided so that its orientation flat is perpendicular to the propagation direction of the acoustic wave, therefore the second substrate 20 will be bonded so that the normal line of the orientation {110} of the crystal of silicon is inclined by 60° relative to the X-axis of the piezoelectric crystal of the propagation direction of the acoustic wave. Note that, the orientation flat of the first substrate 10 is perpendicular to the propagation direction of the acoustic wave (X-axis direction of the LT substrate).

When using such a composite substrate 1 to configure the acoustic wave element 30, the strength of the bulk wave spurious signals in the 2f-band can be reduced. Below, the effect thereof will be verified.

An IDT electrode 31 and reflectors provided so as to sandwich the IDT electrode 31 therebetween were formed on the composite substrate 1 in the present disclosure to prepare a model of the acoustic wave element 30 which was then evaluated by simulation. The model of the basic configuration of the acoustic wave element 30 which was prepared was as follows:

[First Substrate 10]
Material: 42° Y-cut X-propagated LiTaO$_3$ substrate
Orientation flat: Direction perpendicular to X-axis of piezoelectric crystal
Thickness: 2 μm
[IDT Electrode 31]
Material: Al—Cu alloy
(However, there is a 6 nm underlying layer made of Ti between it and first substrate 10.)
Thickness (Al—Cu alloy layer): 131.5 nm
Electrode fingers 32 of IDT electrode 31:
(Number) 200
(Pitch) 0.791 μm
(Duty) 0.65
(Intersecting width) 20λ (λ=2×pitch)
[Reflectors]
Material: Al—Cu alloy
(However, there is a 6 nm underlying layer made of Ti between it and first substrate 10.)
Thickness (Al—Cu alloy layer): 131.5 nm
Number of reflection electrode fingers: 30
Intersecting width of reflection electrode fingers: 20λ (λ=2×pitch)
Pitch of reflection electrode fingers: 0.791 μm
[Protective Layer Covering IDT Electrode 31 and Reflectors]
Material: SiO$_2$
Thickness: 15 nm
[Second Substrate 20]
Material: Silicon single crystal
Thickness: 230 μm
Crystal orientation: (111)

As the acoustic wave element 30 in the present embodiment, models formed by changing the orientation flat angle of the second substrate 20 were prepared and evaluated by simulation. Further, as a comparative example, a model was prepared for a substrate in which the silicon substrate of the second substrate 20 was given an orientation flat direction the same as generally circulated ones and was evaluated by simulation. Specifically, the models were as follows:

Example 1: Euler angles (φ, θ, ψ)=(−45, −54.7, 15)
Example 2: Euler angles (φ, θ, ψ)=(−45, −54.7, 30)
Example 3: Euler angles (φ, θ, ψ)=(−45, −54.7, 45)
Example 4: Euler angles (φ, θ, ψ)=(−45, −54.7, 60)
Example 5: Euler angles (φ, θ, ψ)=(−45, −54.7, 75)
Example 6: Euler angles (φ, θ, ψ)=(−45, −54.7, 90)
Comparative Example 1: Euler angles (φ, θ, ψ)=(−45, −54.7, 0)

The orientation flat direction of Comparative Example 1 is {110}.

Figure 3A:
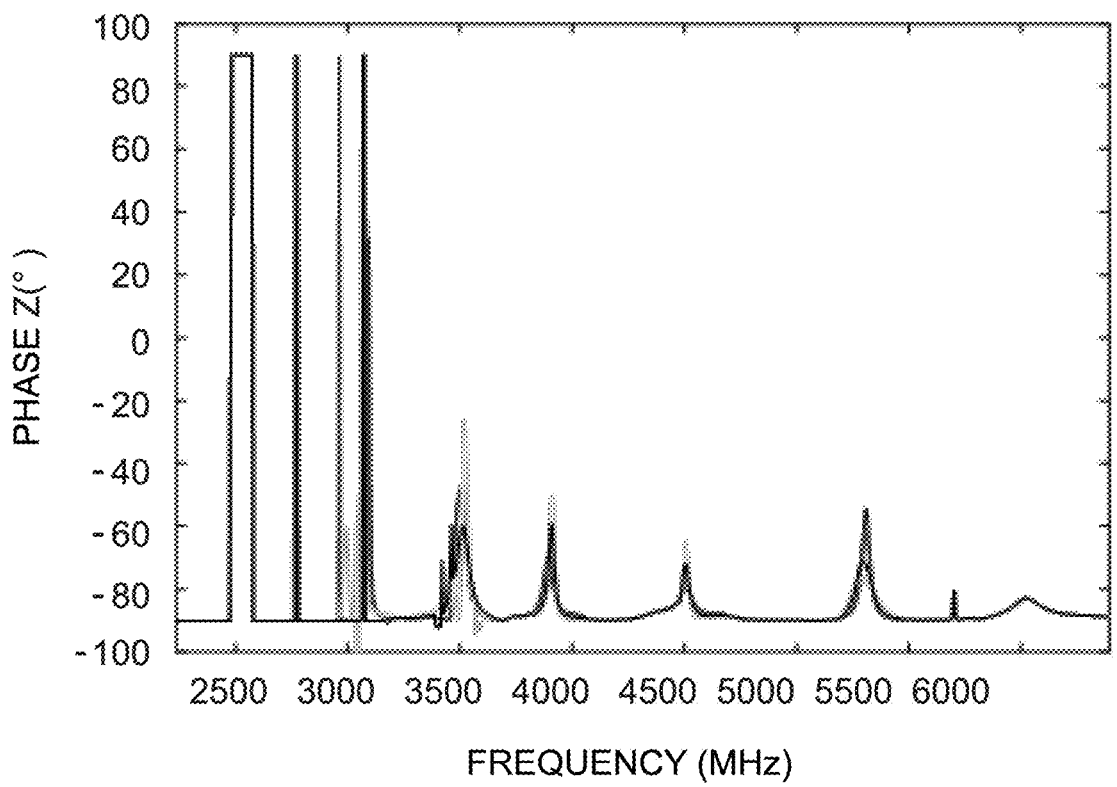
FIG. 3A is a diagram showing frequency characteristics of acoustic wave elements according to examples and comparative examples.
Figure 3B:
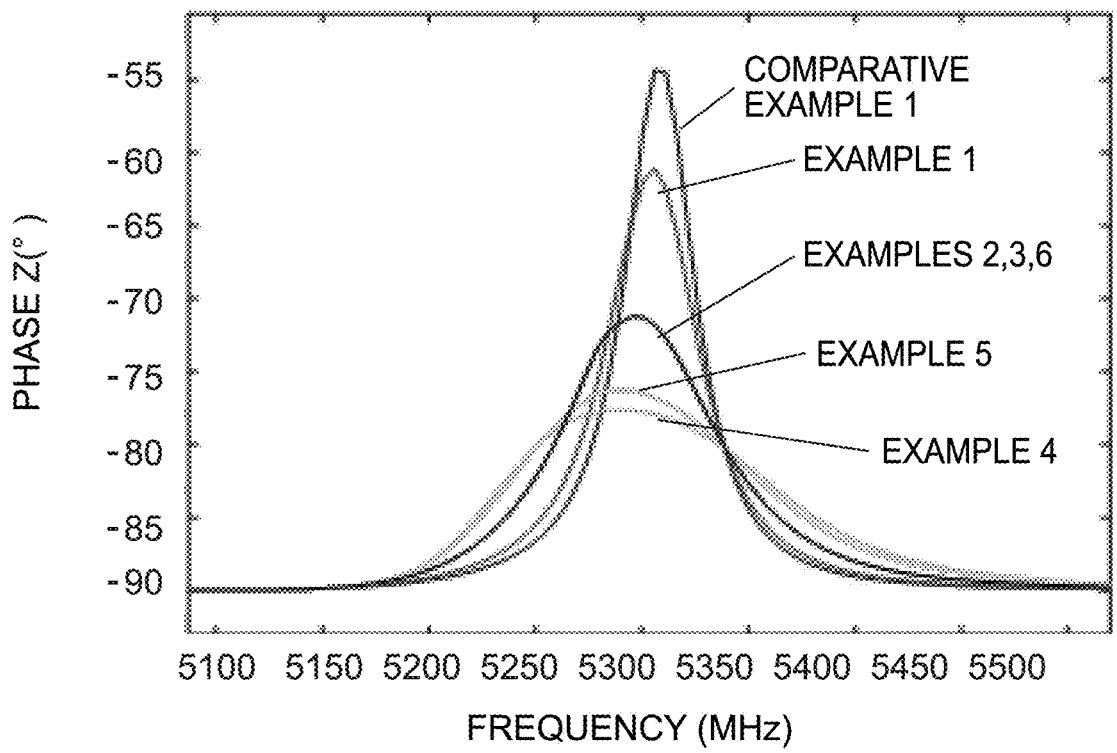
FIG. 3B is an enlarged diagram of the principal part in FIG. 3A.

The impedance characteristics with respect to frequencies in Examples 1 to 6 and Comparative Example 1 will be shown in FIGS. 3A and 3B. In FIGS. 3A and 3B, ordinates show impedances (unit: °), and abscissas show frequencies (unit: MHz). FIG. 3A is a graph showing characteristics of a wide frequency range including a resonance frequency and antiresonance frequency, and FIG. 3B is a partially enlarged graph of FIG. 3A and shows the characteristics of the 2f-band.

As apparent also from FIGS. 3A and 3B, in contrast to Comparative Example 1, a reduction of strength of the bulk wave spurious signals in the 2f-band could be confirmed in Examples 1 to 6. From the above description, when using silicon having the (111) plane as the second substrate 20, by rotation so that ψ of the Euler angles changes from 0°, the strength of the bulk wave spurious signals in the 2f-band is reduced, therefore it becomes possible to provide an acoustic wave element 10 excellent in electrical characteristics. Further, when setting ψ of the Euler angles within a range of 60°±15°, it becomes possible to further reduce the bulk wave spurious signals in the 2f-band.

Note that, a crystal of silicon has a rotational symmetry. Therefore, even when ψ is increased beyond 90°, the strength of the bulk wave spurious signals changes. Specifically, for example, even at the time when ψ was set to −60°, as confirmed, the bulk wave spurious signals could be reduced in the same way.

Next, in order to confirm the influence of the cut angle of the first substrate 10, models were prepared and were verified by using a 38.7° Y-cut and X-propagated substrate and a 46° Y-cut and X-propagated substrate and configuring the other parts in the same way as those explained above.

Figure 4A:
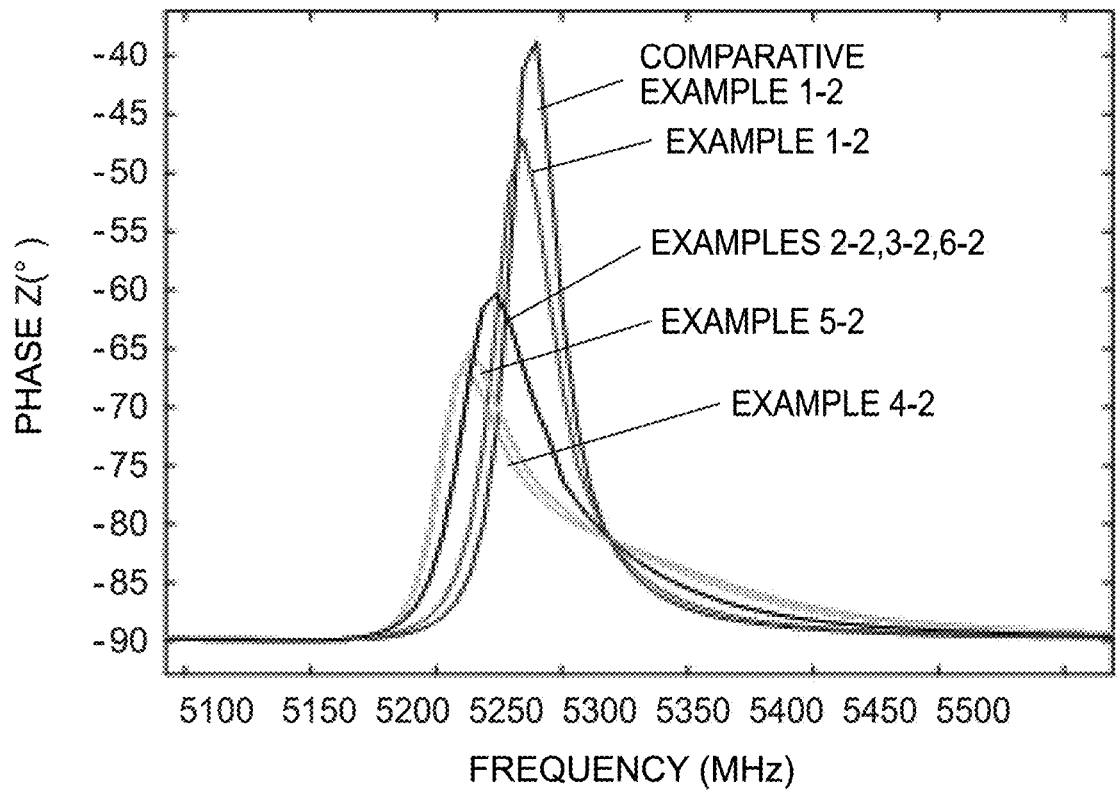
FIGS. 4A and 4B are graphs showing frequency characteristics of acoustic wave elements according to examples and comparative examples.
Figure 4B:
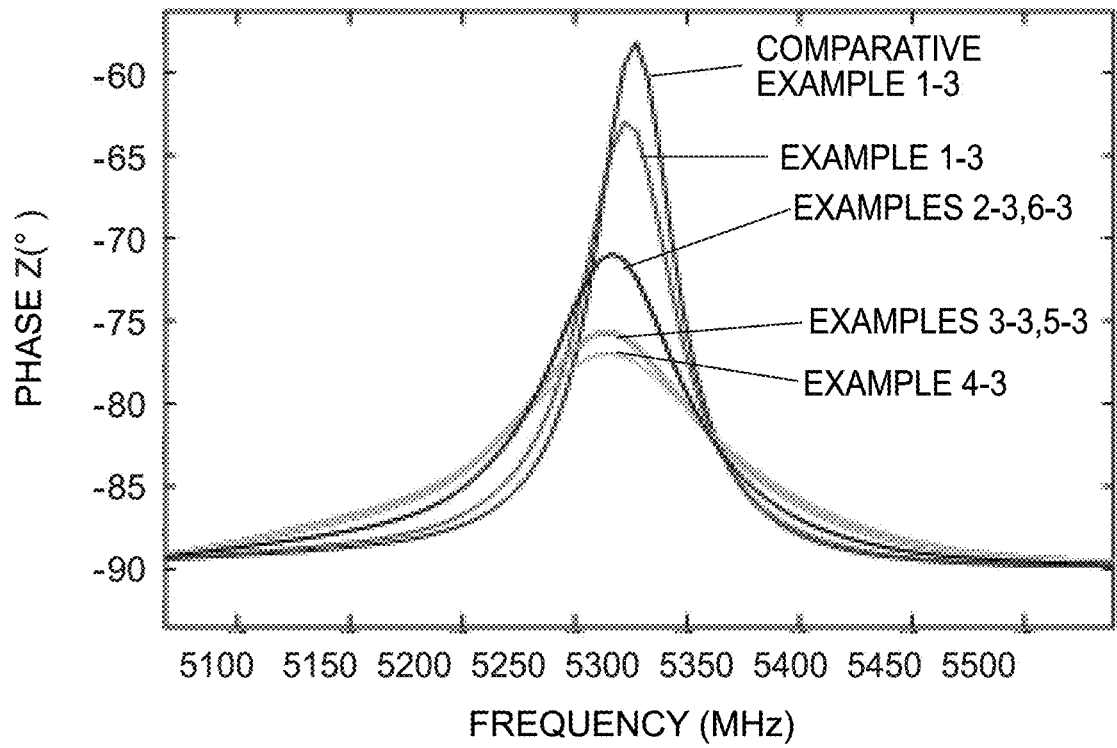

Specifically, as Example 1-2 to Example 6-2 and Comparative Example 1-2, models having the same configurations as those in Examples 1 to 6 and Comparative Example 1 except for the point that the first substrate 10 was configured by a 38.7° Y-cut and X-propagated substrate were prepared. In the same way, as Example 1-3 to Example 6-3 and Comparative Example 1-3, models having the same configurations as those in Examples 1 to 6 and Comparative Example 1 except for the point that the first substrate 10 was configured by a 46° Y-cut and X-propagated substrate were prepared The results thereof will be shown in FIGS. 4A and 4B. FIGS. 4A and 4B are graphs corresponding to FIG. 3B. FIG. 4A shows the impedance characteristics with respect to frequencies in Example 1-2 to Example 6-2 and Comparative Example 1-2, while FIG. 4B shows the impedance characteristics with respect to frequencies in Example 1-3 to Example 6-3 and Comparative Example 1-3.

As apparent also from these results, it was confirmed that the same tendency as that in Examples 1 to 6 and Comparative Example 1 was shown even when the cut angle of the first substrate 10 was changed. That is, by rotation so as to change ψ of the Euler angles from 0°, the strength of the bulk wave spurious signals in the 2f-band is reduced to make it possible to provide the acoustic wave element 10 excellent in the electrical characteristics. In particular, when setting ψ of the Euler angles within the range of 60°±15°, it becomes possible to further reduce the bulk wave spurious signals in the 2f-band.

From the above description, by changing the angle of the silicon crystal relative to the X-axis of the piezoelectric crystal without relying on the cut angle of the first substrate 10, the bulk wave spurious signals in the 2f-band can be reduced. As a result, as confirmed, the frequency characteristics of the acoustic wave element 1 can be raised.

Other Embodiments

Examples of the configurations of other composite substrates 1 capable of reducing the bulk wave spurious signals in the 2f-band will be explained. First, in the second substrates 20, the planar orientations of silicon were changed to (100), (110), and (211), while the directions of the orientation flats were set to the usual {110}. That is, the normal lines of {110} of the silicon crystals and the X-axes of the piezoelectric crystals were made to match.

When using such composite substrates 1 to configure acoustic wave elements 30, the strengths of the bulk wave spurious signals in the 2f-band can be reduced. Below, the effect thereof will be verified.

On the composite substrates 1 in the present disclosure, IDT electrodes 31 and reflectors provided so as to sandwich the IDT electrodes 31 therebetween were formed to prepare models of the acoustic wave elements 30 which were then evaluated by simulation. The models of the basic configurations of the acoustic wave elements 30 which were prepared were as described above. Further, as a comparative example when using a second substrate 20 having a crystal plane other than that described above, a model was prepared also for the case where the planar orientation of the silicon was set to (113). Specifically, they are as follows:

Example 7: Planar orientation (100), ($\varphi$, $\theta$, $\psi$)=(90, 90, −135)

Example 8: Planar orientation (110), ($\varphi$, $\theta$, $\psi$)=(−45, 90, 0)

Example 9: Planar orientation (211), ($\varphi$, $\theta$, $\psi$)=(−63.43, −65.9, 18.4)

Comparative Example 2: Planar orientation (113), ($\varphi$, $\theta$, $\psi$)=(−45, −25.2, 0)

Figure 5:
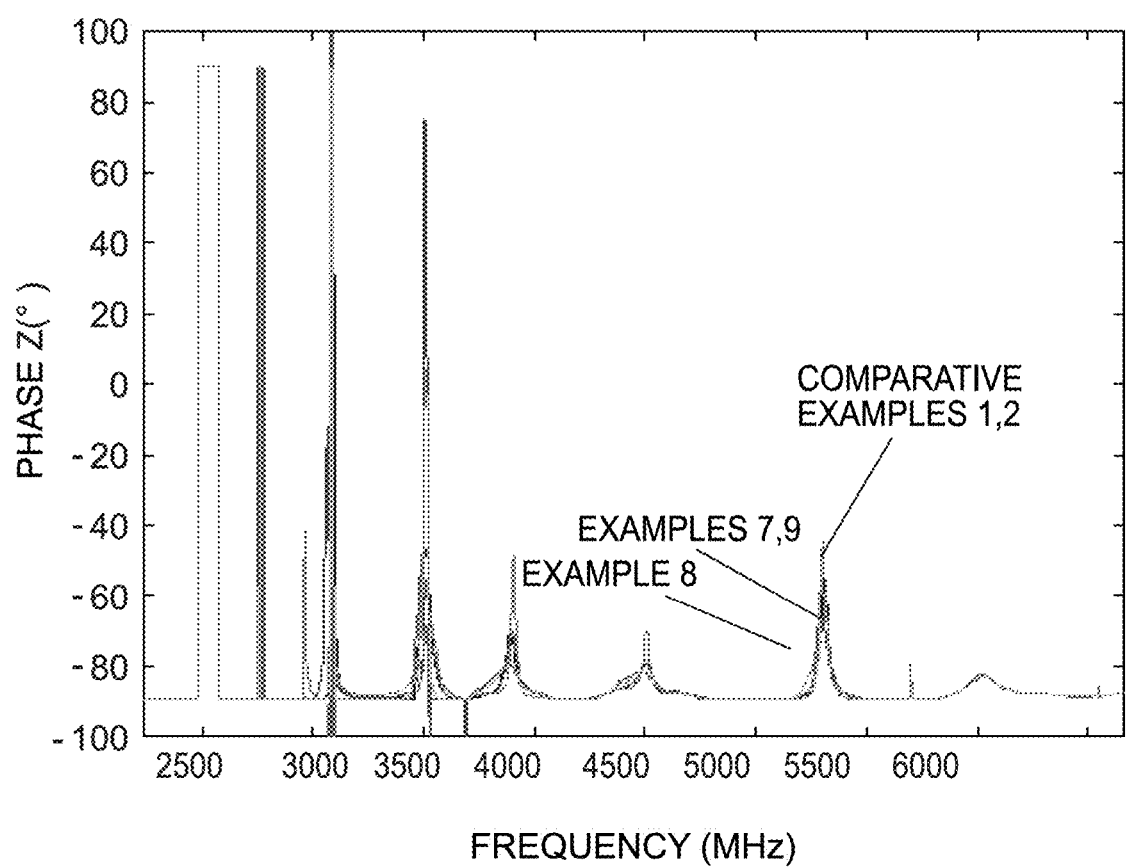
FIG. 5 A graph showing frequency characteristics of acoustic wave elements according to examples and comparative examples.

The impedance characteristics with respect to frequencies in Examples 7 to 9 and Comparative Examples 1 and 2 will be shown in FIG. 5. In FIG. 5, the ordinate shows the impedances (unit: °), and the abscissa shows the frequencies (unit: MHz). FIG. 5 is a graph showing the characteristics in a wide frequency range including the resonance frequency and antiresonance frequency.

As apparent also from FIG. 5, the strengths of the bulk wave spurious signals in the 2f-band were reduced in Examples 7 to 9 relative to Comparative Examples 1 and 2. Note that, in the case of the planar orientation (100) in Example 7, it was confirmed that equal results were obtained in the case where $\psi$ was set to −135° and the case where $\psi$ was set to 45°. Further, from the symmetry of the silicon crystal, it is guessed that the case where the planar orientation is (100) and the case where the planar orientations are (010) and (001) show equal results. From the above description, when using silicon having the (100), (110), or (211) plane as the second substrate 20, it becomes possible to provide an acoustic wave element 10 reduced in the strength of the bulk wave spurious signals in the 2f-band and excellent in the electrical characteristics.

Note that, characteristic changes when changing the cut angle of the first substrate 10 relative to Comparative Examples 1 and 2 and Examples 7 to 9 were verified. Specifically, models were prepared and were verified by using a 38.7° Y-cut and X-propagated substrate and a 46° Y-cut and X-propagated substrate as the first substrate 10 and configuring the other parts in the same way as those explained above.

As a result, it was confirmed that the same tendency as that in Examples 7 to 9 and Comparative Examples 1 and 2 was shown even when the cut angle of the first substrate 10 was changed. From the above description, as confirmed, by changing the planar orientation of the silicon crystal relative to the piezoelectric crystal without relying on the cut angle of the first substrate 10, the bulk wave spurious signals in the 2f-band can be reduced. As a result, the frequency characteristics of the acoustic wave element 1 can be raised.

Note that, at the time when the cut angle of the first substrate 10 was 37.8°, the strength of the bulk wave spurious signals became large compared with the time when the cut angles were 42° and 46°. For this reason, the cut angle may be set to 42° by considering the electromechanical coupling coefficient etc. of the first substrate 10 as well.

Other Embodiments

Examples of the configurations of other composite substrates 1 capable of reducing the bulk wave spurious signals in the 2f-band will be explained. First, in the second substrate 30, the planar orientation of silicon was set to (110), and the direction of the orientation flat was changed. Specifically, from Example 8, $\psi$, of the Euler angles was changed as follows:

Example 10: ($\varphi$, $\theta$, $\psi$)=(−45, 90, 15)
Example 11: ($\varphi$, $\theta$, $\psi$)=(−45, 90, 30)
Example 12: ($\varphi$, $\theta$, $\psi$)=(−45, 90, 45)
Example 13: ($\varphi$, $\theta$, $\psi$)=(−45, 90, 60)
Example 14: ($\varphi$, $\theta$, $\psi$)=(−45, 90, 75)
Example 15: ($\varphi$, $\theta$, $\psi$)=(−45, 90, 90)

Figure 6:
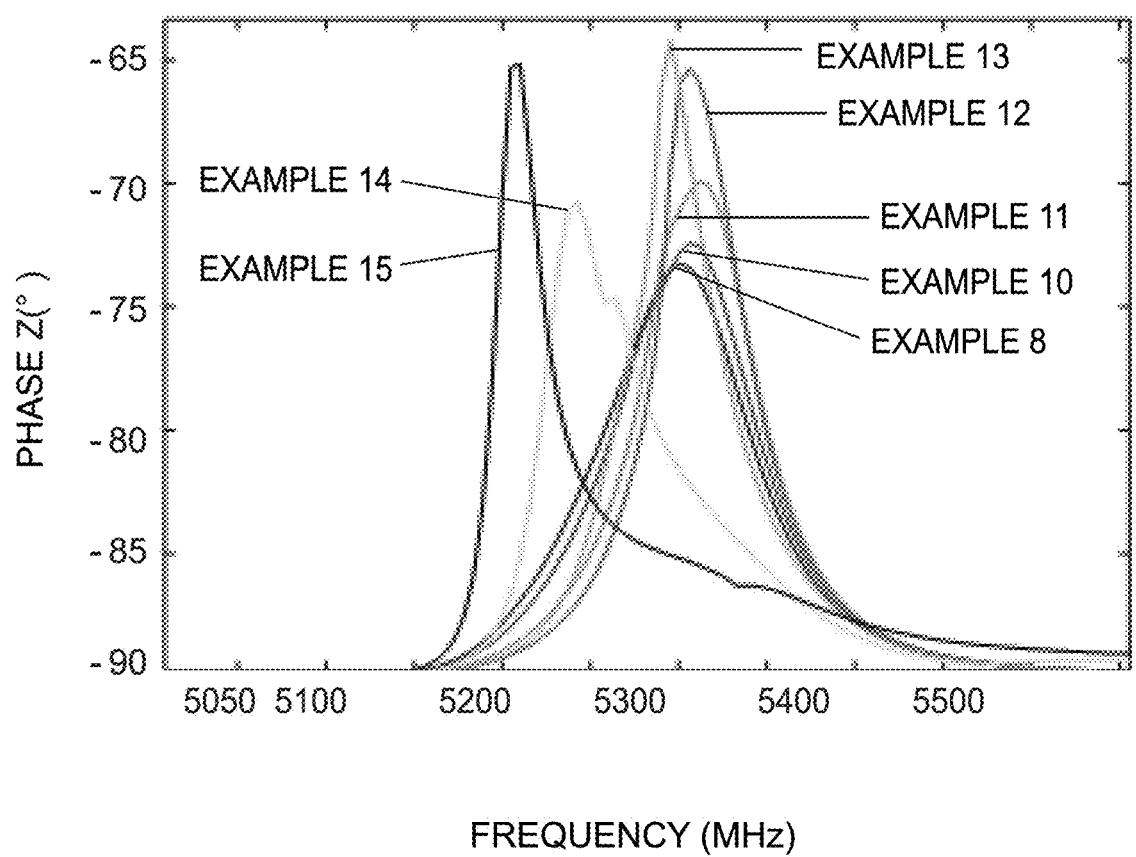
FIG. 6 A graph showing frequency characteristics of acoustic wave elements according to examples and comparative examples.

The impedance characteristics with respect to frequencies in Example 8 and Examples 10 to 15 will be shown in FIG. 6. In FIG. 6, the ordinate shows the impedances (unit: °), and the abscissa shows the frequencies (unit: MHz). FIG. 6 is a graph corresponding to FIG. 3B and shows the characteristics of the 2f-band.

As apparent also from FIG. 6, in all of Example 8 and Examples 10 to 15, the strengths of the bulk wave spurious signals in the 2f-band were reduced in comparison with Comparative Example 1. Further, when changing 4 by rotating the silicon crystal within the plane, compared with 45° to 60°, in the case of 0° to 15°, as confirmed, the strength of the bulk wave spurious signals could be made further smaller. When considered from the symmetry of the silicon crystal, it was confirmed that the strength of the bulk wave spurious signals could be made further smaller particularly at the time of −15° to 15°.

Further, when rotating it by 75° to 90°, it was confirmed that the peak position of the bulk wave spurious signals could be shifted to a low frequency side. Specifically, it was confirmed that it could be moved by 90 MHz at the time of rotation by 90°. When considered from the symmetry of the silicon crystal, as confirmed, the spurious signals could be shifted when setting $\psi$ to 75° to 115°.

From the above description, when use is made of a silicon crystal having the planar orientation (110) as the second substrate 20, by setting the Euler angle to −15° to 15°, in particular, the strength of the bulk wave spurious signals can be reduced. This angle represents inclination of the normal line of {110} by 15° or less relative to the X-axis of the piezoelectric crystal of the first substrate 10.

Further, when use was made of a silicon crystal having the planar orientation (110) as the second substrate 20, it was confirmed that the bulk wave spurious signals could be shifted to a low frequency side by setting $\psi$ of the Euler angles within the range of 90°±15°.

Note that, characteristic changes when changing the cut angle of the first substrate 10 relative to Example 8 and Examples 10 to 15 were verified. Specifically, models were prepared and were verified by using a 38.7° Y-cut and X-propagated substrate and 46° Y-cut and X-propagated substrate as the first substrate 10 and configuring the other parts in the same way as those explained above.

As a result, it was confirmed that the same tendency as that in Example 8 and Examples 10 to 15 was shown even when the cut angle of the first substrate 10 was changed. From the above description, as confirmed, by changing the planar orientation of the silicon crystal relative to the piezoelectric crystal without relying on the cut angle of the first substrate 10, the bulk wave spurious signals in the 2f-band can be reduced. As a result, the frequency characteristic of the acoustic wave element 1 can be raised.

Other Embodiments

Examples of the configurations of other composite substrates 1 capable of reducing the bulk wave spurious signals in the 2f-band will be explained. First, in the second substrate 30, the planar orientation of silicon was set to (100), and the direction of the orientation flat was changed. Specifically, ψ of the Euler angles equivalent to that in Example 7 was changed from 45° as follows:
Example 16: (φ, θ, ψ)=(90, 90, 0)
Example 17: (φ, θ, ψ)=(90, 90, 15)
Example 18: (φ, θ, ψ)=(90, 90, 30)
Example 19: (φ, θ, ψ)=(90, 90, 60)
Example 20: (φ, θ, ψ)=(90, 90, 75)
Example 21: (φ, θ, ψ)=(90, 90, 90)

Figure 7:
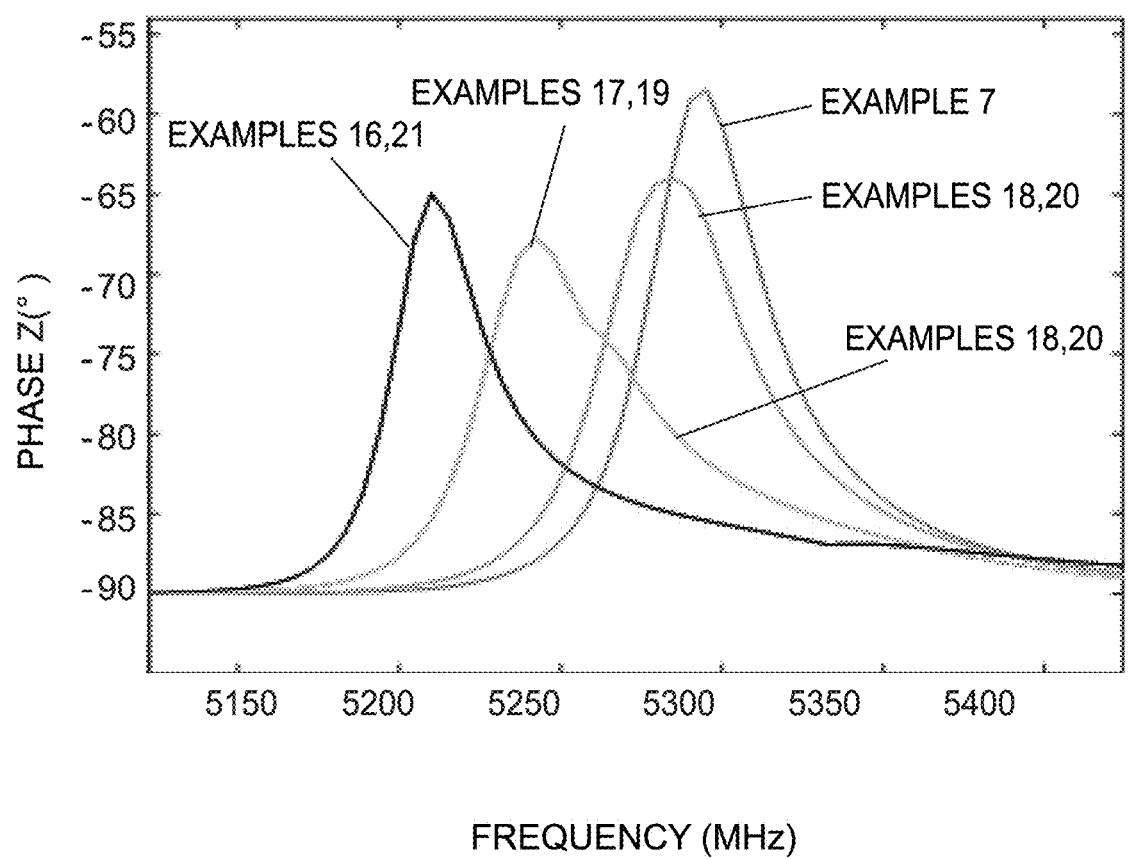
FIG. 7 A graph showing frequency characteristics of acoustic wave elements according to examples and comparative examples.
Figure 8A:
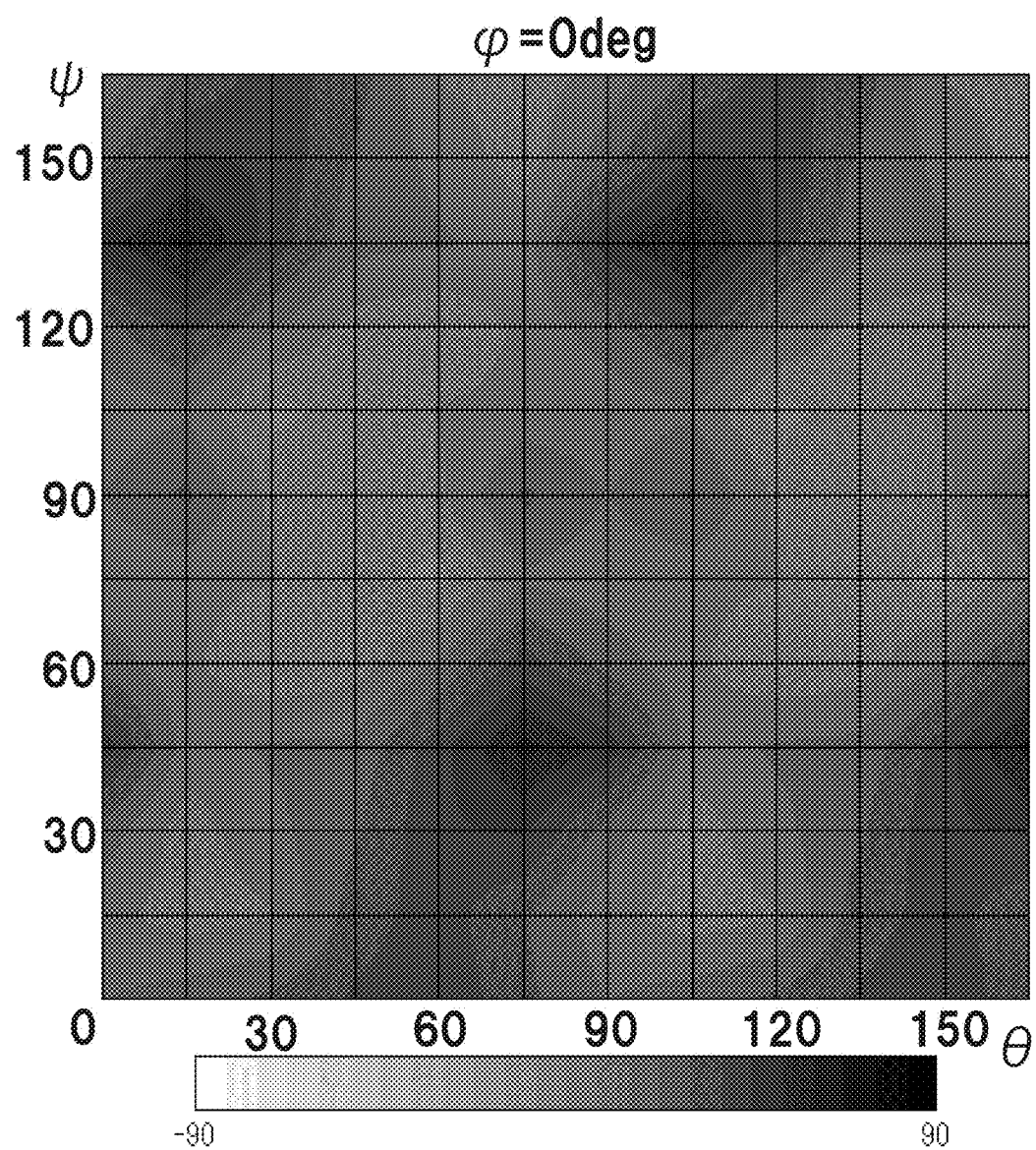
FIG. 8A A graph displaying the maximum value of the phases of the bulk wave spurious signals when changing the Euler angle of the silicon crystal by a contour line.
Figure 8B:
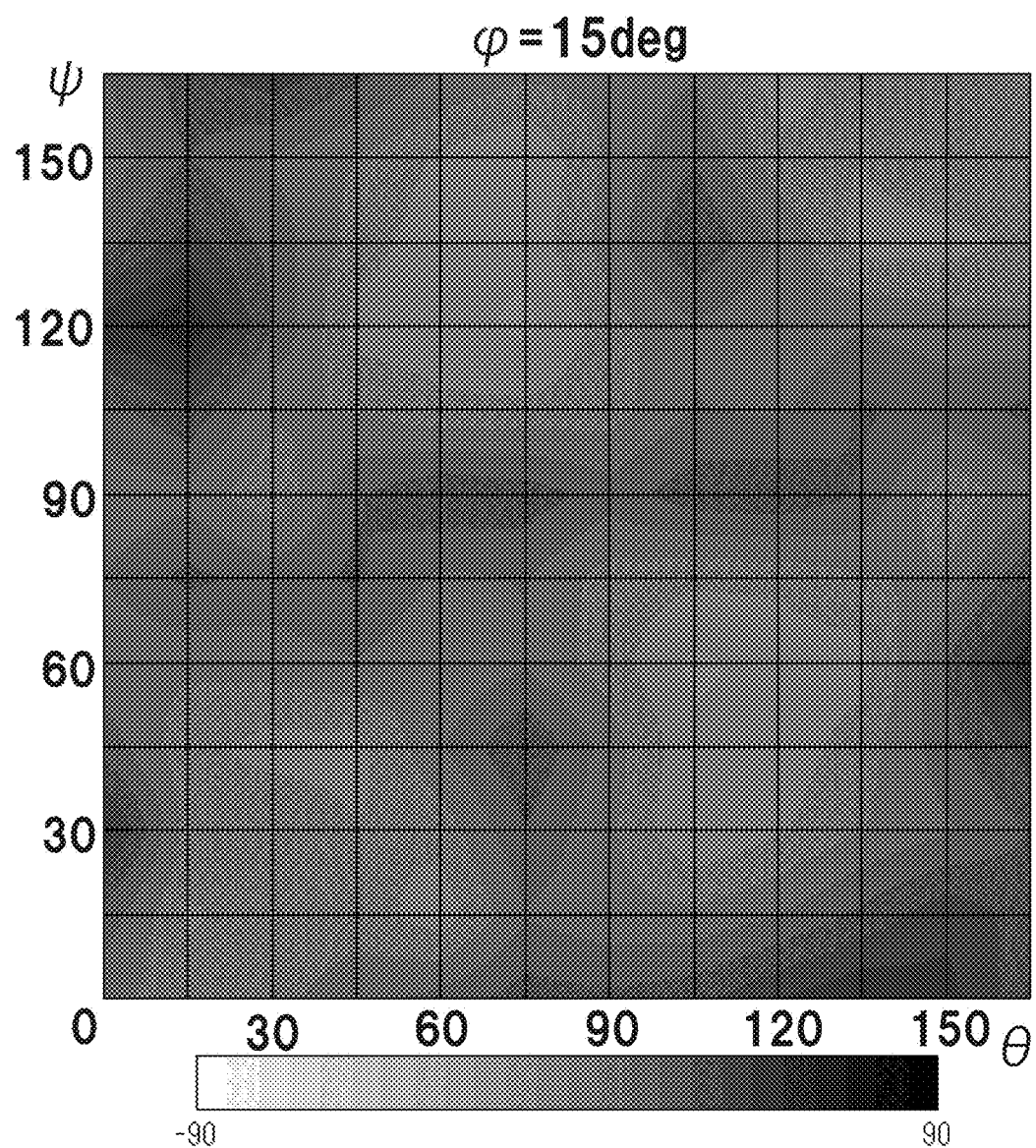
FIG. 8B A graph displaying the maximum value of the phases of the bulk wave spurious signals when changing the Euler angle of the silicon crystal by a contour line.
Figure 8C:
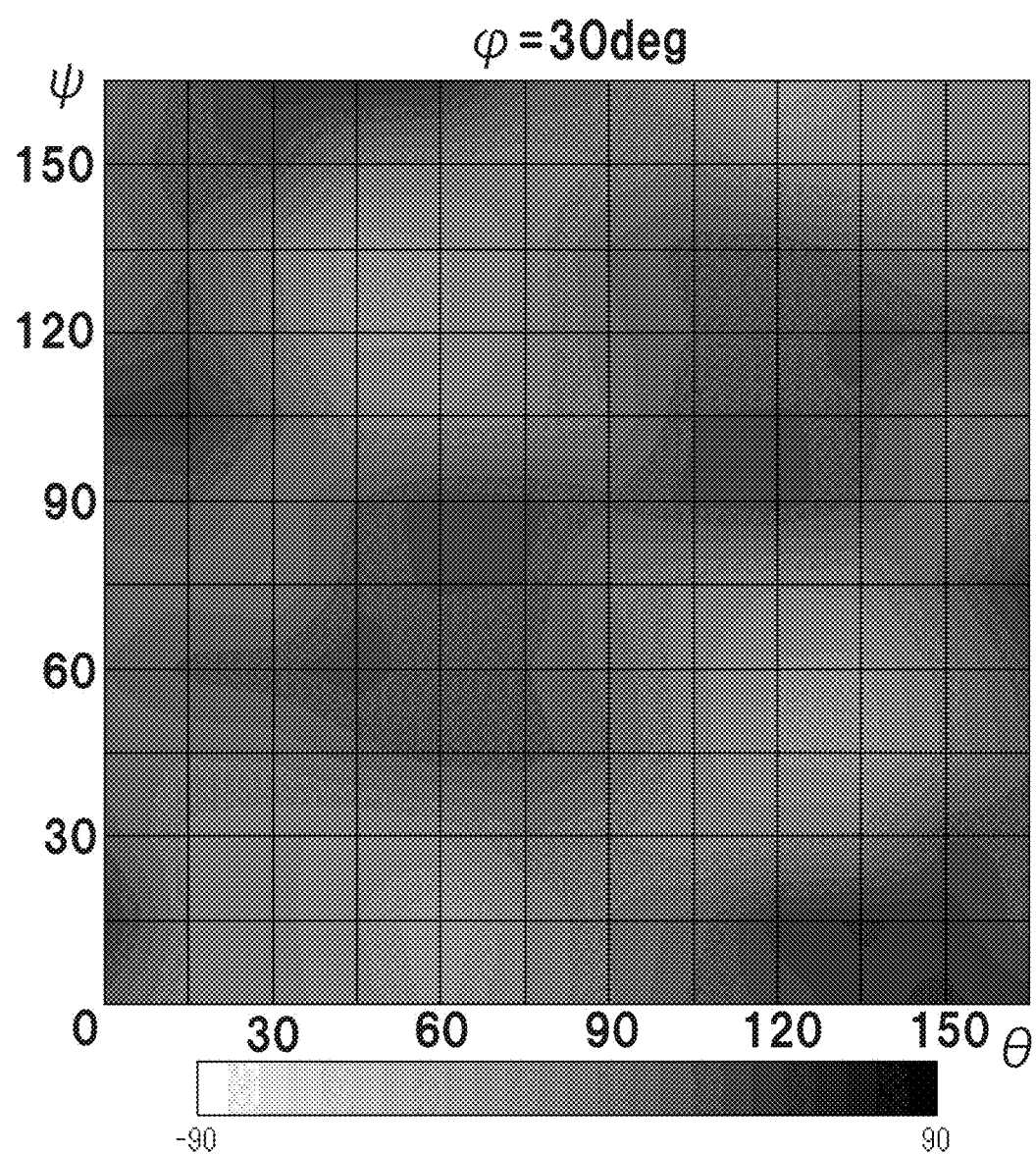
FIG. 8C A graph displaying the maximum value of the phases of the bulk wave spurious signals when changing the Euler angle of the silicon crystal by a contour line.
Figure 8D:
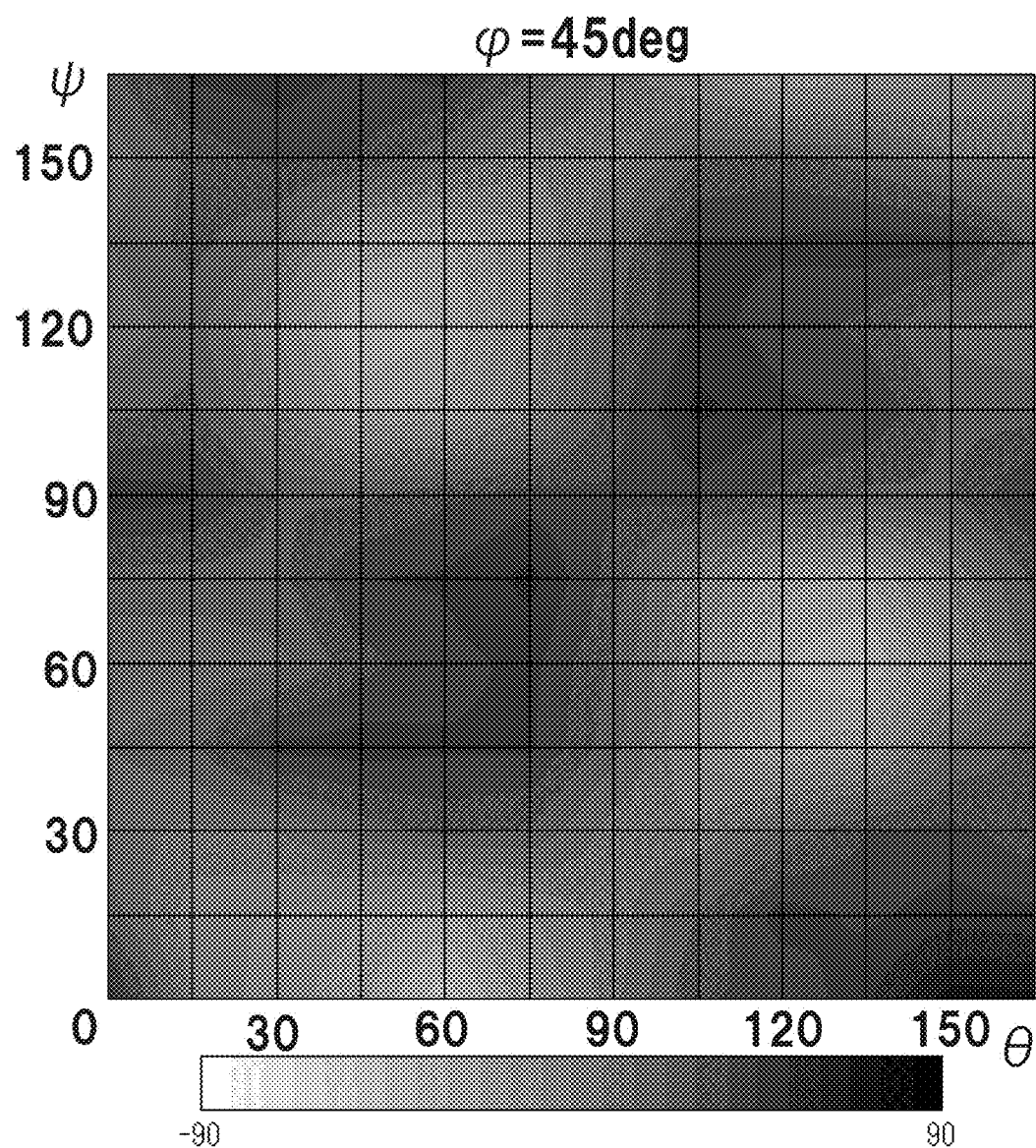
FIG. 8D A graph displaying the maximum value of the phases of the bulk wave spurious signals when changing the Euler angle of the silicon crystal by a contour line.
Figure 8E:
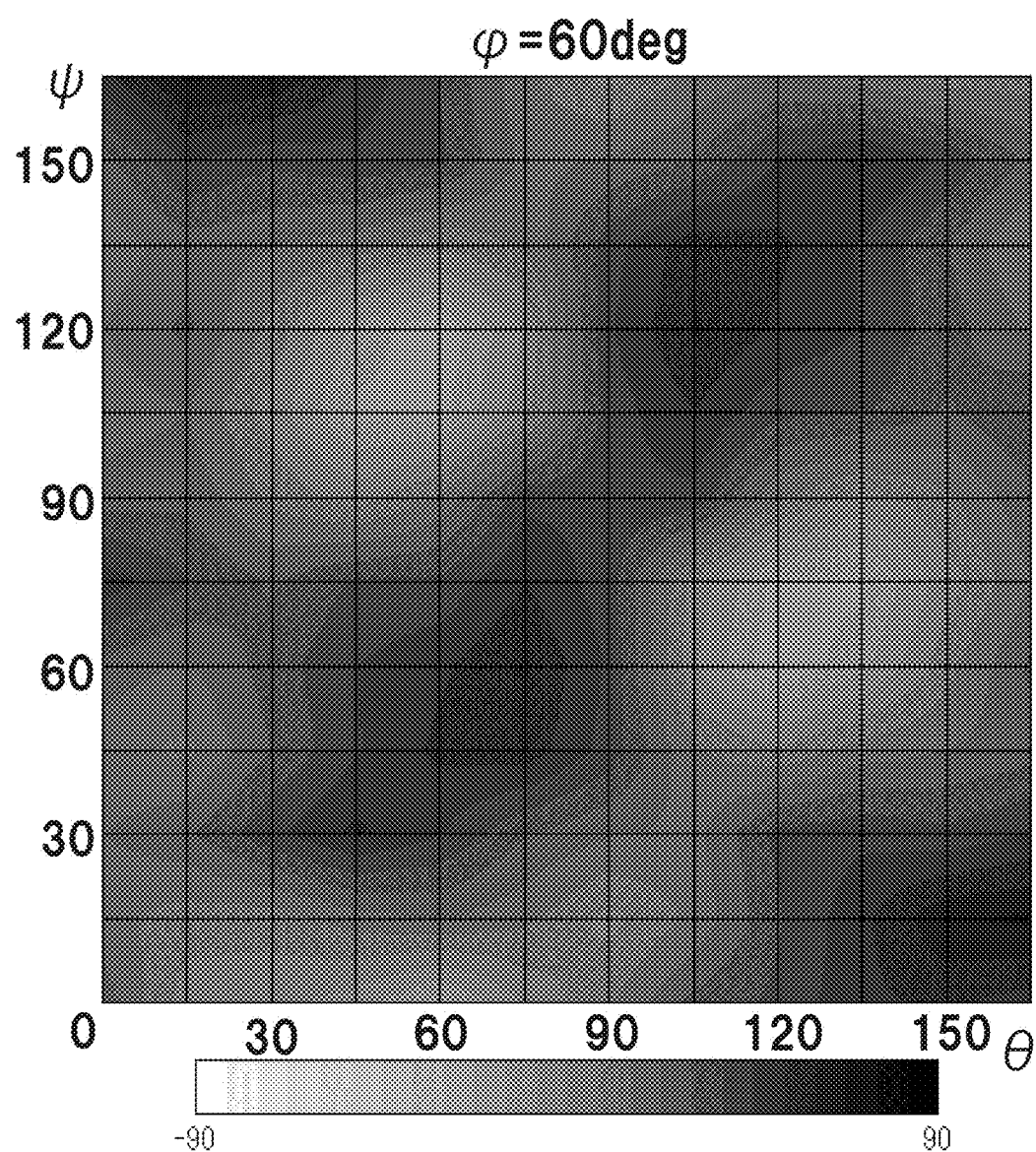
FIG. 8E A graph displaying the maximum value of the phases of the bulk wave spurious signals when changing the Euler angle of the silicon crystal by a contour line.
Figure 8F:
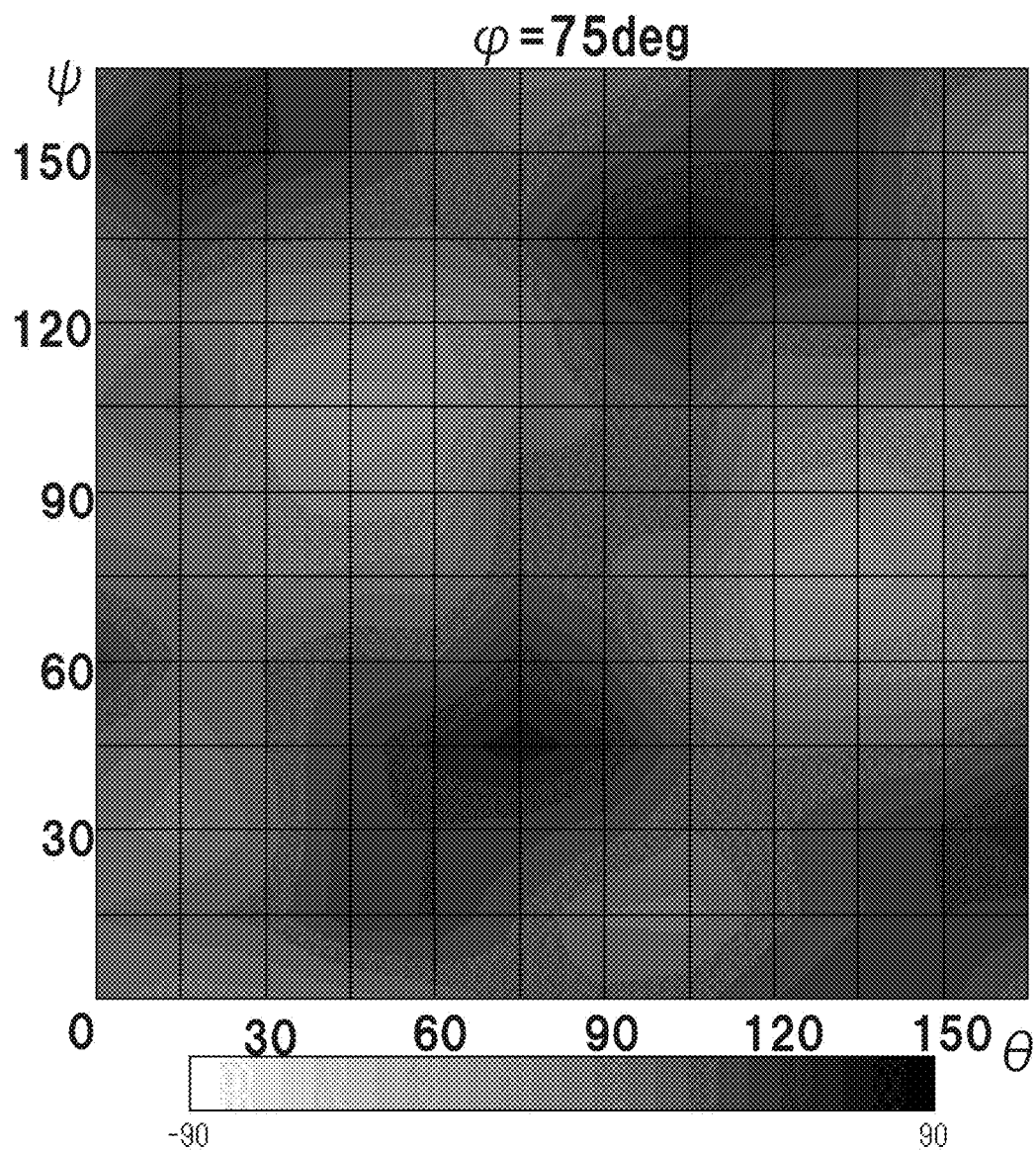
FIG. 8F A graph displaying the maximum value of the phases of the bulk wave spurious signals when changing the Euler angle of the silicon crystal by a contour line.
Figure 8G:
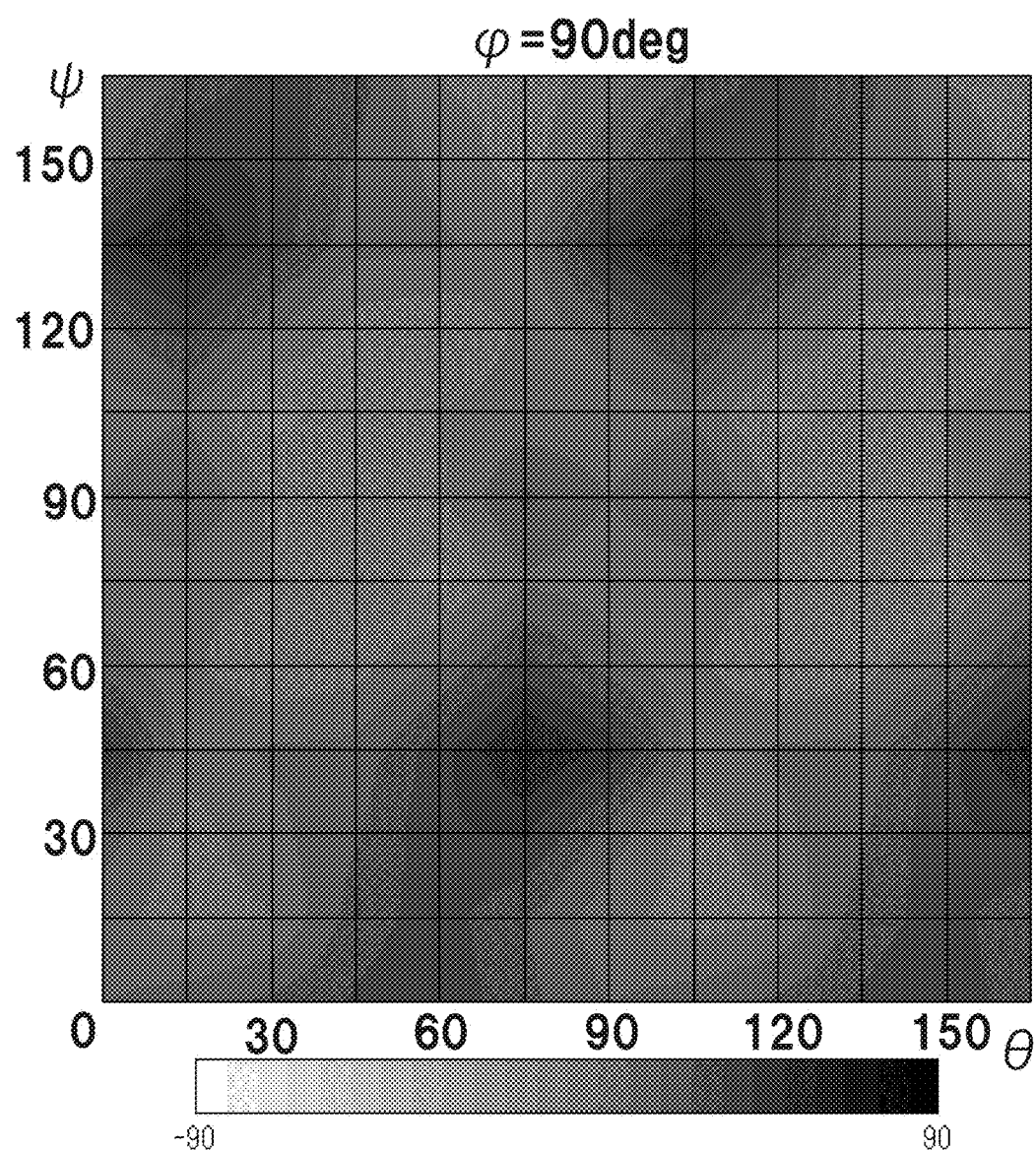
FIG. 8G A graph displaying the maximum value of the phases of the bulk wave spurious signals when changing the Euler angle of the silicon crystal by a contour line.
Figure 8H:
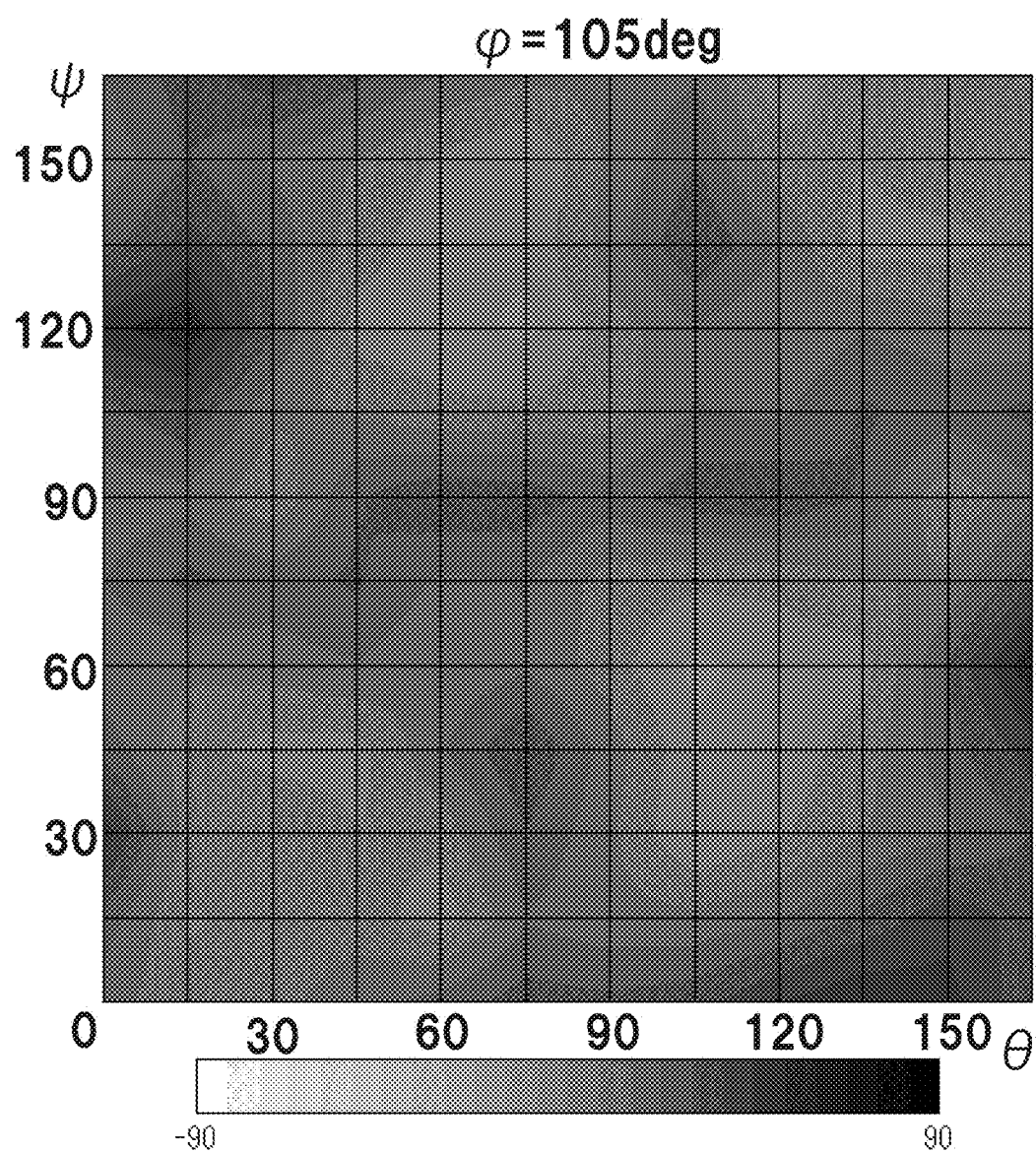
FIG. 8H A graph displaying the maximum value of the phases of the bulk wave spurious signals when changing the Euler angle of the silicon crystal by a contour line.
Figure 8I:
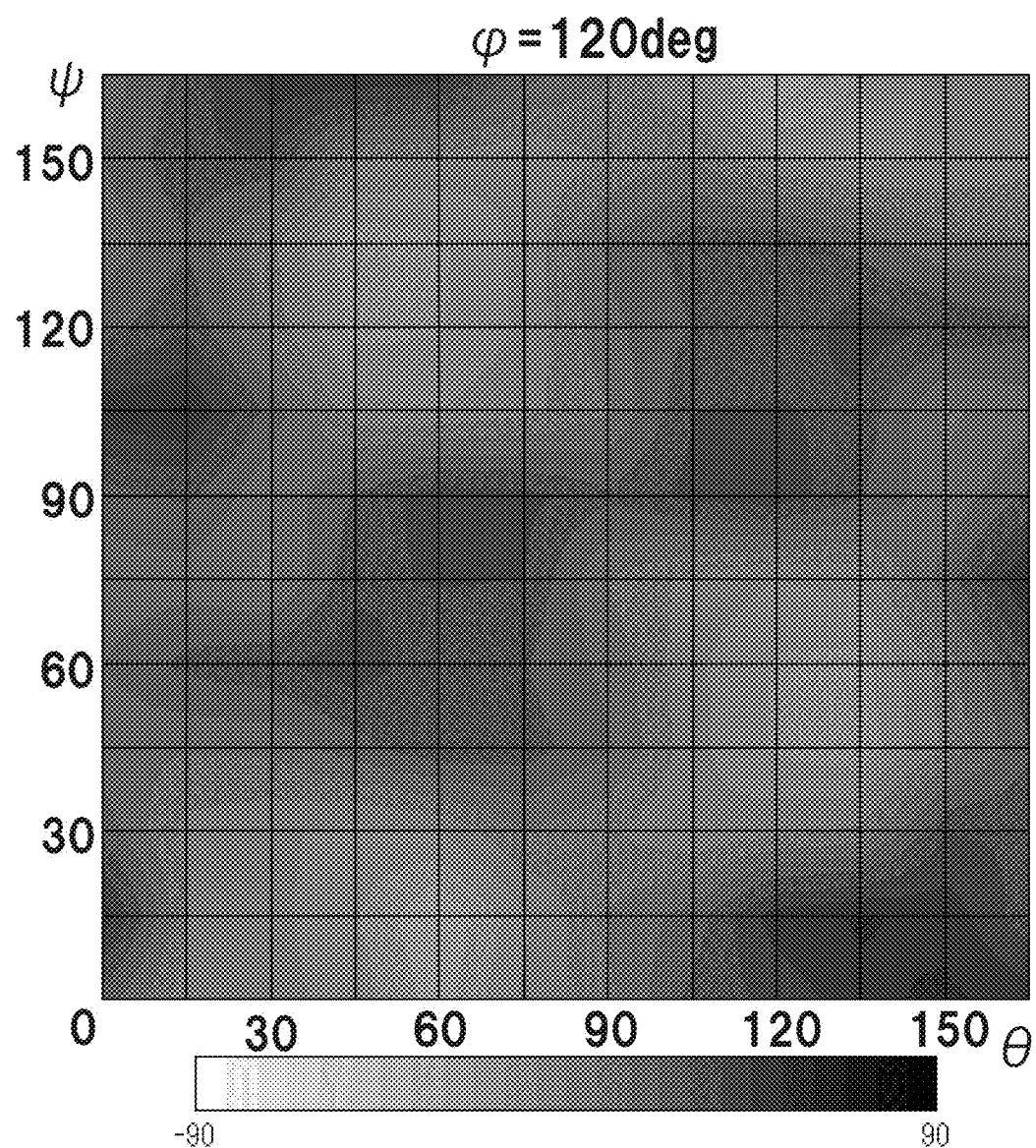
FIG. 8I A graph displaying the maximum value of the phases of the bulk wave spurious signals when changing the Euler angle of the silicon crystal by a contour line.
Figure 8J:
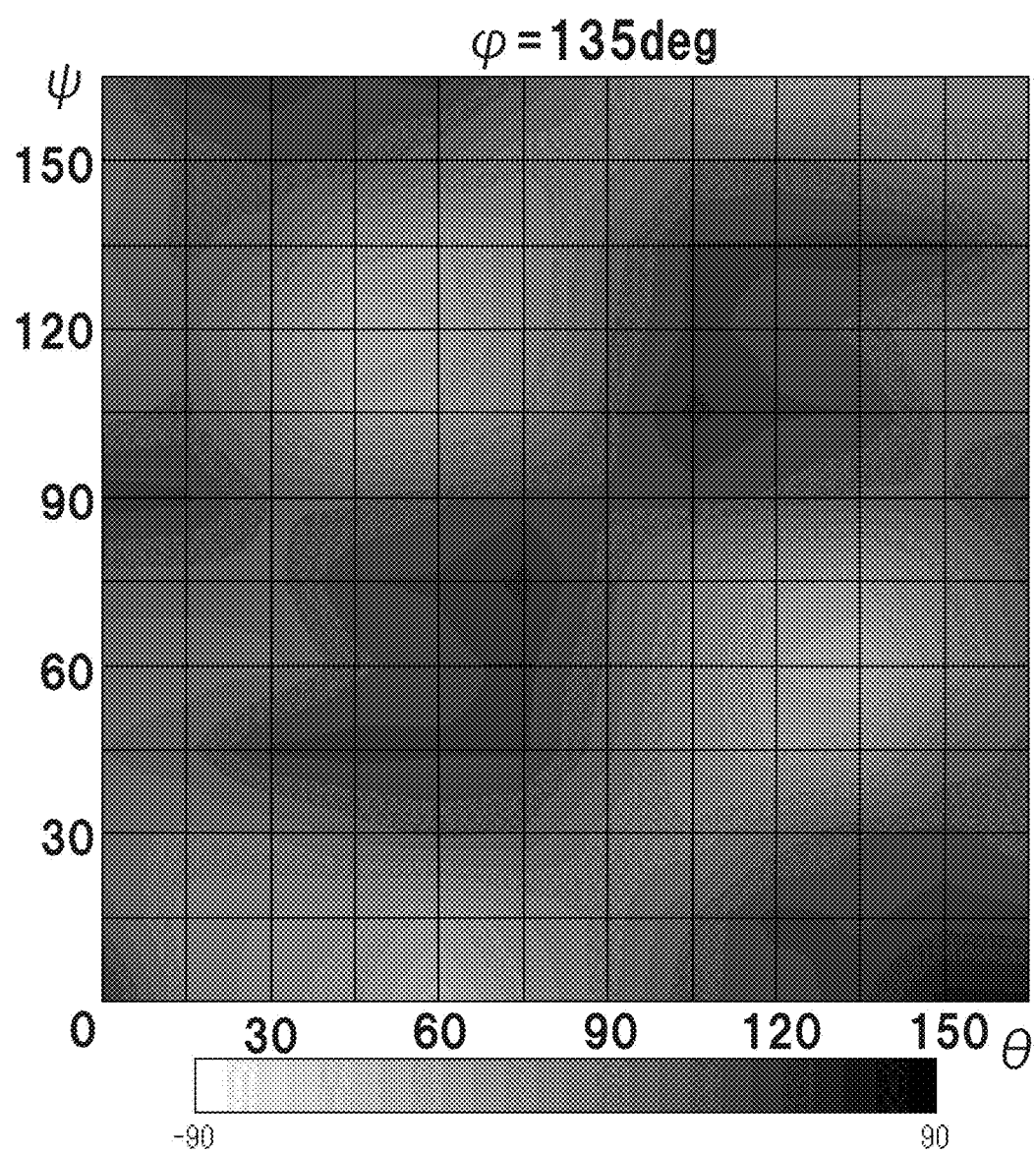
FIG. 8J A graph displaying the maximum value of the phases of the bulk wave spurious signals when changing the Euler angle of the silicon crystal by a contour line.
Figure 8K:
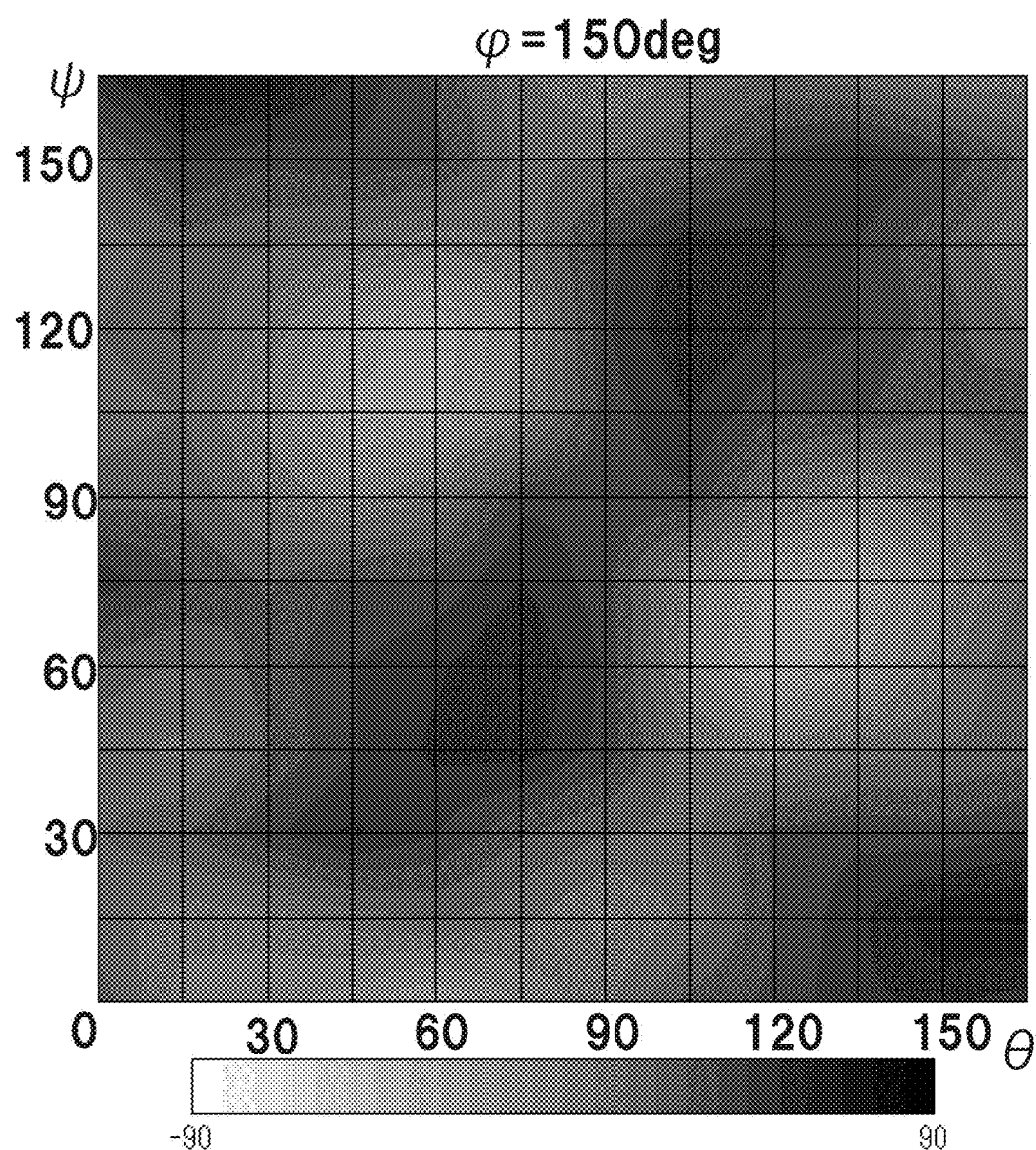
FIG. 8K A graph displaying the maximum value of the phases of the bulk wave spurious signals when changing the Euler angle of the silicon crystal by a contour line.
Figure 8L:
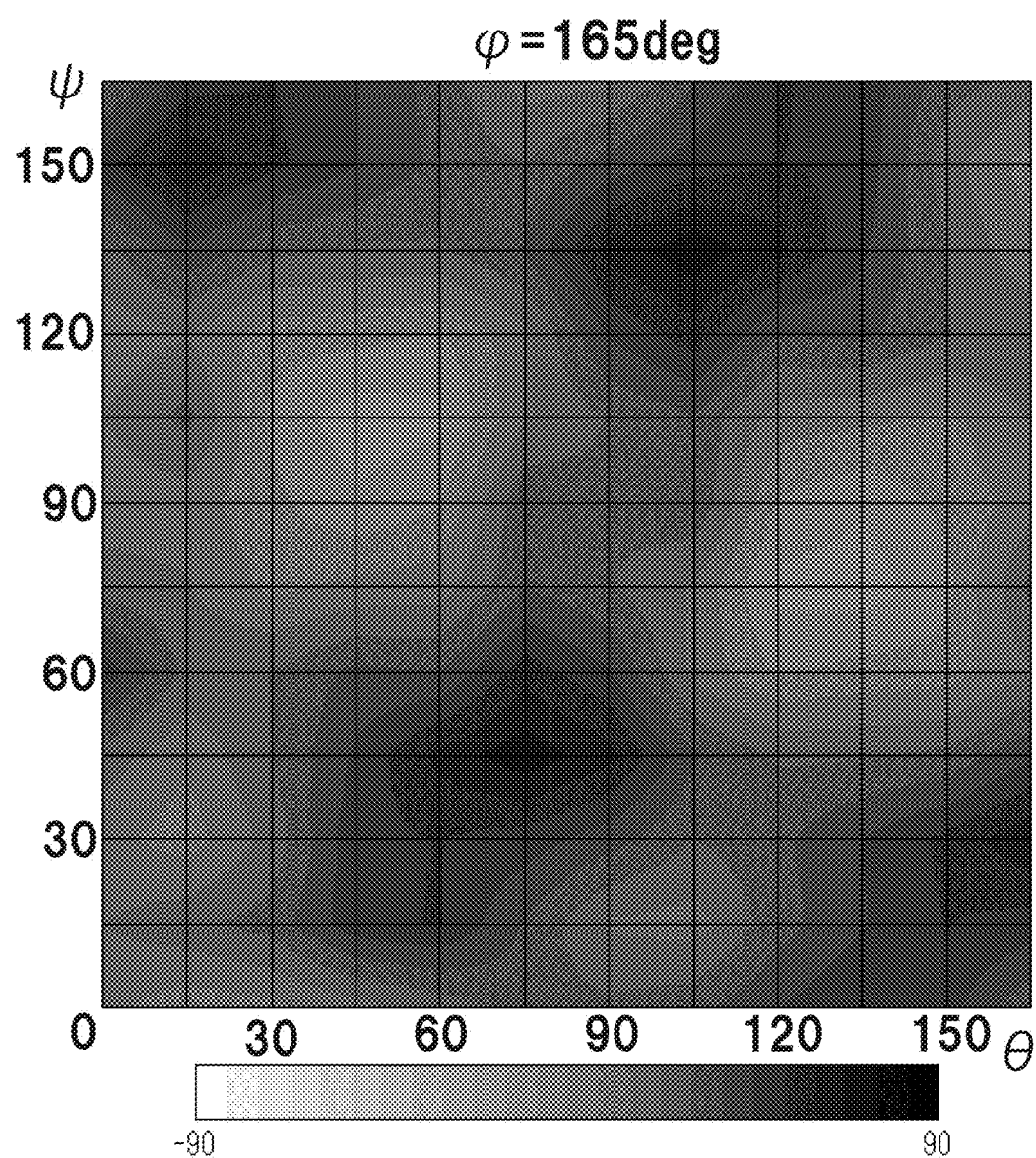
FIG. 8L A graph displaying the maximum value of the phases of the bulk wave spurious signals when changing the Euler angle of the silicon crystal by a contour line.

The impedance characteristics with respect to frequencies in Example 7 and Examples 16 to 21 will be shown in FIG. 7. In FIG. 7, the ordinate shows the impedances (unit: °), and the abscissa shows the frequencies (unit: MHz). FIG. 7 is a graph corresponding to FIG. 3B and shows the characteristics of the 2f-band.

As apparent also from FIG. 7, in all of Example 7 and Examples 16 to 21, the strength of the bulk wave spurious signals in the 2f-band was reduced in comparison with Comparative Example 1. Further, when changing ψ by rotating the silicon crystal within the plane, as confirmed, the strength of the bulk wave spurious signals could be made further smaller by shifting the same from 45°.

Further, it was confirmed that the peak position of the bulk wave spurious signals could be shifted to a low frequency side by setting ψ to 0° and 90°. Specifically, it was confirmed that the position could be moved by 80 MHz when setting ψ to 90°. When considered from the symmetry of the silicon crystal, as confirmed, the spurious signals could be shifted when setting ψ to 0°, 90°, 180°, and 270°.

From the above description, when use is made of a silicon crystal having the planar orientation (100) as the second substrate 20, by offset of the Euler angle from 45°, the strength of the bulk wave spurious signals can be reduced.

Further, it was confirmed that the bulk wave spurious signals could be shifted to a low frequency side by setting ψ of the Euler angles to 0° and 90°.

Note that, characteristic changes when changing the cut angle of the first substrate 10 relative to Example 7 and Examples 16 to 21 were verified. Specifically, models were prepared and verified by using a 38.7° Y-cut and X-propagated substrate and 46° Y-cut and X-propagated substrate as the first substrate 10 and configuring the other parts in the same way as those explained above.

As a result, it was confirmed that the same tendency as that in 7 and Examples 16 to 21 was shown even when the cut angle of the first substrate 10 was changed. From the above description, as confirmed, by changing the planar orientation of the silicon crystal relative to the piezoelectric crystal without relying on the cut angle of the first substrate 10, the bulk wave spurious signals in the 2f-band can be reduced. As a result, the frequency characteristic of the acoustic wave element 1 can be raised.

Further, the bulk wave spurious signals in the 2f-band (5 GHz) when changing the Euler angle of the silicon crystal in the second substrate 20 was simulated. Specifically, for a case where use was made of a 42° cut LT substrate having a thickness of 2.2 μm as the first substrate 10, the pitch of the electrode fingers 32 was set to 0.78 μm, and the duty was set to 0.5, the Euler angle of the second substrate 20 was changed for simulation. In FIG. 8A to FIG. 8L, the maximum value of phases of bulk wave spurious signals at each Euler angle was plotted on a contour line. In FIG. 8, combinations of Euler angles having small phases represent configurations capable of suppressing the bulk wave spurious signals in the 2f-band. As apparent also from this graph, along with the rotation of the Euler angle, the spurious strength repeatedly changes periodically in all of the directions of φ, θ, and ψ. By combination of these, the minimum point at which the bulk wave spurious signals can be reduced can be found.

As apparent from the results in FIG. 8, in the case of Euler angles (φ, θ, ψ)=(90, 90, ψ0) (case of (100) plane and rotation of ψ0), by setting ψ0 (that is, rotation angle relative to the LT substrate) to 90°, the spurious signals can be made smaller.

In the same way, in the case of Euler angles (φ, θ, ψ)=(135, 90, ψ1) (case of (110) plane and rotation of ψ1), by setting ψ1 to 20°, the spurious signals can be made smaller.

Further, in the case of Euler angles (φ, θ, ψ)=(135, 54.7, ψ2) (case of (111) plane and rotation of ψ2), by setting ψ2 to 0° and 120°, the spurious signals can be made smaller.

Here, the match between the degree of spurious signal strength in FIG. 8 and the degree of spurious signal strength at each Euler angle in each example explained above will be explained.

Equivalent planes capable of displaying the Euler angles of the crystal planes in examples within an angular range of 0° to 180° are as follows. When setting the value of ψ in the examples as ψx, the Euler angles (φ, θ, ψx) of the (111) plane were (−45, −54.7, ψx) in the examples. The plane equivalent to that becomes (135, 54.7, ψx+120). In the same way, the plane equivalent to the (110) plane becomes (135, 90, ψx), the plane equivalent to the (210) plane becomes (116.57, 65.9, ψx+180), and the plane equivalent to the (113) plane becomes (135, 25.2, ψx+180).

For example, when verifying the case where use is made of the (111) plane of Si, in the case of Example 4 where Euler angles (ψ, θ, ψ)=(−45, −54.7, 60), an equivalent plane at the angle of 0° to 180° has the Euler angles (φ, θ, ψ)=(135, 54.7, 120), it can be confirmed that the equivalent plane becomes a region having a small phase. In the same way, it can be confirmed that the plane (135, 54.7, 60) which is equivalent to Comparative Example 1 where Euler angles (φ, θ, ψ)=(−45, −54.7, 0) is not good in phase characteristic. That is, the results in FIG. 3 and FIG. 8J coincide.

Next, when verifying the case where use is made of the (100) plane of Si, in the case of Example 7 where Euler angles (φ, θ, ψ)=(90, 90, −135), an equivalent plane at the angle of 0° to 180° has the Euler angles (φ, θ, ψ)=(90, 90, 45), it can be confirmed that the equivalent plane becomes a region having a smaller phase compared with the comparative example. However, when compared with the other planes, the phase characteristic is not particularly improved and is average. However, by setting ψ to 15, 75, and 100° (Examples 17 and 20) even in that, improvement of the phase characteristic can be confirmed. That is, the results in FIG. 7 and FIG. 8G coincide.

Further, when verifying the case where use is made of the (110) plane of Si, in the case of Examples 7, 8, and 14 in which Euler angles (φ, θ, ψ)=(−45, 90, ψ), an equivalent plane at the angle of 0° to 180° has the Euler angles (φ, θ, ψ)=(135, 90, ψ), and it can be confirmed that a region having the smallest phase is formed in Example 8 (That is, ψ=135°). That is, the results in FIG. 6 and FIG. 8J coincide.

Note that, among the Euler angles, the combinations capable of reducing the spurious signals the most are Euler angles (φ, θ, ψ)=(45, 60, 0) and Euler angles (φ, θ, ψ)=(135, 60, 0). Here, the Si crystal is a cubic crystal. Therefore, needless to say basically the spurious signals can be reduced in the same way even in the case of Euler angles which are equivalent to the Euler angles described above.

Next, simulation was carried out in the same way for the case where the pitch of the electrode fingers and the cut angle of the LT substrate were changed. Specifically, for the case where the pitch of the electrode fingers 32 was set to 0.8 μm and the other conditions were made the same (the 42° cut LT substrate having a thickness of 2.2 qua was used as the first substrate 10 and the duty of the electrode fingers 32 was set to 0.5), the Euler angles of the second substrate 20 were varied for simulation. Further, for the case where the cut angle of the LT substrate was set to 46° and the other conditions were made the same (use was made of the LT substrate having a thickness of 2.2 μm as the first substrate 10, the pitch of the electrode fingers 32 was set to 0.78 μm, and the duty was set to 0.5), the Euler angles of the second substrate 20 were varied for simulation.

As a result, the tendency of the Euler angles that the phase could be reduced even if the pitch of the electrode fingers and the cut angle of the LT substrate were changed was the same. From the above description, it could be confirmed that loss could be suppressed by adjusting the Euler angles of the second substrate irrespective of the cut angle and electrode finger pitch.

Further, the cause of fluctuation of bulk wave spurious signals according to the Euler angles of the Si crystal explained above is considered to be a bulk wave vibration mode generated at an interface between the first substrate 10 (LT substrate in this example) and the Si single crystal. For this reason, it is guessed that the strength of the spurious signals changes only according to the configuration in the vicinity of the interface between the LT substrate (first substrate 10) and the Si single crystal, the relationships explained above stand irrespective of the thickness of the LT substrate (first substrate 10), and so on.

REFERENCE SIGNS LIST

1: composite substrate
10: first substrate
20: second substrate
30: acoustic wave element
31: IDT electrode

The invention claimed is:

1. A composite substrate comprising:
a first substrate comprised of a piezoelectric single crystal; and
a second substrate comprised of a silicon single crystal bonded to the first substrate, wherein
in the second substrate, a planar orientation is (111), and φ of Euler angles (φ, θ, ψ) is offset from 0°.

2. The composite substrate according to claim 1, wherein in the second substrate, ψ of the Euler angles (φ, θ, ψ) is set to a range of 60°±15°.

3. The composite substrate according to claim 2, wherein in bonded surfaces of the first substrate and the second substrate, crystal surfaces of the piezoelectric single crystal and the crystal surface of the silicon single crystal directly contact each other.

4. An acoustic wave element comprising:
the composite substrate according to claim 2; and
an IDT electrode formed on an upper surface of the first substrate of the composite substrate.

5. An acoustic wave element comprising:
the composite substrate according to claim 3; and
an IDT electrode formed on an upper surface of the first substrate of the composite substrate.

6. The composite substrate according to claim 1, wherein a normal line of {110} of the second substrate is inclined within a range of 60°±15° relative to an X-axis of the piezoelectric single crystal in the first substrate.

7. The composite substrate according to claim 6, wherein in bonded surfaces of the first substrate and the second substrate, crystal surfaces of the piezoelectric single crystal and the crystal surface of the silicon single crystal directly contact each other.

8. An acoustic wave element comprising:
the composite substrate according to claim 6; and
an IDT electrode formed on an upper surface of the first substrate of the composite substrate.

9. An acoustic wave element comprising:
the composite substrate according to claim 7; and
an IDT electrode formed on an upper surface of the first substrate of the composite substrate.

10. The composite substrate according to claim 1, wherein in bonded surfaces of the first substrate and the second substrate, crystal surfaces of the piezoelectric single crystal and the crystal surface of the silicon single crystal directly contact each other.

11. An acoustic wave element comprising:
the composite substrate according to claim 10; and
an IDT electrode formed on an upper surface of the first substrate of the composite substrate.

12. An acoustic wave element comprising:
the composite substrate according to claim 1; and
an IDT electrode formed on an upper surface of the first substrate of the composite substrate.

13. A composite substrate comprising:
a first substrate comprised of a piezoelectric single crystal; and
a second substrate comprised of a silicon single crystal bonded to the first substrate, wherein in the second substrate, a planar orientation is any of (110), (100), and (211);
wherein, in the second substrate, the planar orientation is (110), and ψ of Euler angles (φ, θ, ψ) is set to 0°±15°.

14. The composite substrate according to claim 13, wherein in bonded surfaces of the first substrate and the second substrate, crystal surfaces of the piezoelectric single crystal and the crystal surface of the silicon single crystal directly contact each other.

15. An acoustic wave element comprising:
the composite substrate according to claim 13; and
an IDT electrode formed on an upper surface of the first substrate of the composite substrate.

16. An acoustic wave element comprising:
the composite substrate according to claim 14; and
an IDT electrode formed on an upper surface of the first substrate of the composite substrate.

17. A composite substrate comprising:
- a first substrate comprised of a piezoelectric single crystal; and
- a second substrate comprised of a silicon single crystal bonded to the first substrate, wherein in the second substrate, a planar orientation is any of (110), (100), and (211);
- wherein, in the second substrate, the planar orientation is (110), and a normal line of {110} of the second substrate is inclined within a range of 0°±15° relative to an X-axis of the piezoelectric single crystal in the first substrate.

18. The composite substrate according to claim 17, wherein in bonded surfaces of the first substrate and the second substrate, crystal surfaces of the piezoelectric single crystal and the crystal surface of the silicon single crystal directly contact each other.

19. An acoustic wave element comprising:
- the composite substrate according to claim 17; and
- an IDT electrode formed on an upper surface of the first substrate of the composite substrate.

20. An acoustic wave element comprising:
- the composite substrate according to claim 18; and
- an IDT electrode formed on an upper surface of the first substrate of the composite substrate.

* * * * *